(12) United States Patent
Lee et al.

(10) Patent No.: US 11,387,307 B2
(45) Date of Patent: Jul. 12, 2022

(54) DISPLAY DEVICE HAVING A SENSOR AREA

(71) Applicant: SAMSUNG DISPLAY CO., LTD., Yongin-si (KR)

(72) Inventors: Seung Chan Lee, Hwaseong-si (KR); Gun Hee Kim, Seoul (KR); Sung Jin Hong, Seoul (KR); Yoo Min Ko, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 177 days.

(21) Appl. No.: 16/928,840

(22) Filed: Jul. 14, 2020

(65) Prior Publication Data
US 2021/0028261 A1    Jan. 28, 2021

(30) Foreign Application Priority Data

Jul. 22, 2019    (KR) .......................... 10-2019-0088340

(51) Int. Cl.
*H01L 29/08* (2006.01)
*H01L 27/32* (2006.01)

(52) U.S. Cl.
CPC ...... *H01L 27/3272* (2013.01); *H01L 27/3225* (2013.01); *H01L 27/3276* (2013.01)

(58) Field of Classification Search
CPC ............. H01L 27/3272; H01L 27/3276; H01L 27/3225

USPC .......................................................... 257/40
See application file for complete search history.

(56) References Cited

U.S. PATENT DOCUMENTS

| | | | |
|---|---|---|---|
| 2016/0163770 A1* | 6/2016 | Kim .................... | H01L 27/3218 257/40 |
| 2016/0365406 A1* | 12/2016 | Adachi ............... | H01L 51/5284 |
| 2017/0294492 A1* | 10/2017 | Lv ....................... | H01L 27/3281 |
| 2018/0026080 A1* | 1/2018 | Lee ...................... | H01L 27/3211 257/40 |
| 2018/0366586 A1 | 12/2018 | Song et al. | |
| 2019/0013368 A1 | 1/2019 | Chung et al. | |
| 2019/0073946 A1 | 3/2019 | Su | |

FOREIGN PATENT DOCUMENTS

| | | |
|---|---|---|
| KR | 10-2006-0110245 | 10/2006 |
| KR | 10-2016-0046152 | 4/2016 |
| KR | 1020180088551 | 8/2018 |

* cited by examiner

*Primary Examiner* — Phuc T Dang
(74) *Attorney, Agent, or Firm* — F. Chau & Associates, LLC

(57) ABSTRACT

A display device includes a display panel including a main area and a sensor area. Sensor devices overlap the sensor area of the display panel in a thickness direction of the display panel. The display panel includes first subpixels, which are disposed in the sensor area, and second subpixels, which are disposed in the main area. The number of transistors of each of the first subpixels is different from the number of transistors of each of the second subpixels.

33 Claims, 24 Drawing Sheets

DISPLAY DEVICE HAVING A SENSOR AREA

This application claims priority under 35 U.S.C § 119 to Korean Patent Application No. 10-2019-0088340, filed on Jul. 22, 2019, in the Korean Intellectual Property Office (KIPO), the disclosure of which is incorporated by reference herein in its entirety.

TECHNICAL FIELD

The present disclosure relates to a display device and, more specifically, to a display device having a sensor area.

DISCUSSION OF THE RELATED ART

Display devices are becoming more widely available in a great variety of different forms. For example, display devices have been adapted for use in a variety of electronic devices such as a smartphones, a digital cameras, notebook/laptop computers, navigation devices, smart and traditional televisions (TV), and the like. A typical display device may include a display panel, which includes a plurality of pixels connected to scan lines, data lines, and power supply lines for displaying an image. Display devices may further include various sensor devices such as a proximity sensor for detecting the presence of a user nearby, an illumination sensor for detecting luminance, and an iris sensor for recognizing the user's iris. The sensor devices may be disposed in holes that are provided at the front of the display device so as not to overlap with the display panel.

Meanwhile, as the types and functions of display devices has diversified, the demand for display devices in various designs has increased. For a smartphone, for example, a display device may have a hole or notch within the display area for accommodating the various sensor devices so that the sensor devices do not need to be disposed on a periphery of the display area, thereby providing a widened display area. Some other display devices may avoid the need for holes and notches by disposing the sensors to at least partially overlap with the display area. However, if the sensor devices are disposed to at least partially overlap with the display panel, the sensing capabilities of the sensor devices may be degraded because the sensor devices are hidden by pixels, scan lines, data lines, and power supply lines of the display panel.

SUMMARY

A display device includes a display panel including a main area and a sensor area. A plurality of sensor devices at least partially overlap the sensor area of the display panel in a thickness direction of the display panel. The display panel includes first subpixels, which are disposed in the sensor area, and second subpixels, which are disposed in the main area, and the number of transistors of each of the first subpixels is different from the number of transistors of each of the second subpixels.

The number of transistors of each of the first subpixels may be smaller than the number of transistors of each of the second subpixels.

The display panel may further include scan lines, data lines, and emission lines. The first subpixels and the second subpixels each may include a driving transistor, which controls a driving current that flows from a first electrode to a second electrode of the driving transistor, in accordance with a data voltage applied to a gate electrode of the driving current. A light-emitting element is connected to the second electrode of the driving transistor. A first transistor is turned on by a scan signal from one of the scan lines to connect the gate electrode of the driving transistor and an initialization voltage line to which an initialization voltage is applied. A second transistor is turned on by a scan signal from another one of the scan lines to connect the first electrode of the driving transistor and one of the data lines. A third transistor is turned on by a scan signal from yet another one of the scan lines to connect the first and second electrodes of the driving transistor. A fourth transistor is turned on by an emission signal from one of the emission signals to connect the first electrode of the driving transistor and a first driving voltage line to which a first driving voltage is applied. A fifth transistor is turned on by an emission signal from another one of the emission lines to connect the second electrode of the driving transistor and the light-emitting element.

Each of the second subpixels may further include a sixth transistor which is turned on by a scan signal from yet still another one of the scan lines to connect a first electrode of the light-emitting element and the initialization voltage line.

The display panel may further include scan lines which at least partially overlap the first subpixels and the second subpixels and to which scan signals are applied. The number of scan lines at least partially overlapping with each of the first subpixels may be different from the number of scan lines at least partially overlapping with each of the second subpixels.

The number of scan lines at least partially overlapping with each of the first subpixels may be smaller than the number of scan lines at least partially overlapping with each of the second subpixels.

The display panel may further include a light-transmitting area which is disposed in the sensor area and does not overlap with the first subpixels.

The light-transmitting area may be at least partially surrounded by the first subpixels.

The display panel may further include a first scan connecting line which is connected to one of the scan lines in a wiring area between the light-transmitting area and the first subpixels and is disposed in a different layer from the scan lines.

The display panel may further include an insulating film which is disposed between the first scan connecting line and the scan line to which the first scan connecting line is connected. The first scan connecting line may be connected to the scan line that it is connected with, through a contact hole which penetrates the insulating film.

The display panel may further include initialization voltage lines which at least partially overlap with the first subpixels and the second subpixels and to which initialization voltages are applied, data lines which at least partially overlap with the first subpixels and the second subpixels and to which data voltages are applied, and first driving voltage lines which at least partially overlap with the first subpixels and the second subpixels and to which first driving voltages are applied.

The display panel may further include a power supply connecting line which is connected to one of the first driving voltage lines in the wiring area and is disposed in a different layer from the first driving voltage lines.

One of the data lines may at least partially overlap with one of the initialization voltage lines or the first scan connecting line in the wiring area.

The power supply connecting line may at least partially overlap with one of the scan lines.

The display panel may further include an insulating film which is disposed between the power supply connecting line and one of the first driving voltage lines. The power supply connecting line may be connected to the first driving voltage line that it is connected, through a contact hole which penetrates the insulating film.

The power supply connecting line may be disposed on the data lines and on the first driving voltage lines. The data lines and the first driving voltage lines may be disposed between the initialization voltage lines and the first scan connecting line. The initialization voltage lines and the first scan connecting line may be disposed on the scan lines.

The display panel may further include an initialization connecting line which is connected to one of the initialization voltage lines and may be disposed in a different layer from the initialization voltage lines.

One of the data lines may at least partially overlap with the initialization connecting line or the first scan connecting line in the wiring area.

The display panel may further include an insulating film which is disposed between the initialization connecting line and one of the initialization voltage lines. The initialization connecting line may be connected to the initialization voltage line that it is connected, through a contact hole which penetrates the insulating film.

The power supply connecting line may be disposed on the data lines and on the first driving voltage lines. The data lines and the first driving voltage lines may be disposed on the scan lines. The scan lines may be disposed on the initialization connecting line and on the first scan connecting line.

The display panel may further include a second scan connecting line which is connected to another one of the scan lines and is disposed in a different layer from the scan lines, emission lines which at least partially overlap with the first subpixels and the second subpixels and to which emission signals are applied. An emission connecting line is connected to one of the emission lines and is disposed in a different layer from the emission lines.

In the wiring area, one of the data lines may at least partially overlap with the second scan connecting line, and another one of the data lines may at least partially overlap with the emission connecting line.

The second scan connecting line and the emission connecting line may be disposed in the same layer.

The power supply connecting line may be disposed on the data lines and on the first driving voltage lines. The data lines and the first driving voltage lines may be disposed on the initialization voltage lines and the first scan connecting line. The initialization voltage lines and the first scan connecting line may be disposed on the scan lines and on the emission lines. The scan lines and the emission lines may be disposed on the second scan connecting line and on the emission connecting line.

The display panel may further include a voltage connecting line which is connected to the first driving voltage lines.

The first driving voltage lines may extend primarily in a first direction. The voltage connecting line may extend primarily in a second direction.

The voltage connecting line may be disposed on the first driving voltage lines.

The first driving voltage lines may be disposed on the voltage connecting line.

The voltage connecting line may be disposed in the same layer as the initialization voltage lines and may be disposed on the scan lines.

The initialization voltage lines may be disposed on the voltage connecting line and may be disposed in the same layer as the scan lines.

The first driving voltage lines may be disposed in the same layer as the voltage connecting line.

A display device includes a display panel including a main area and a sensor area. Sensor devices at least partially overlap with the sensor area of the display panel in a thickness direction of the display panel. The display panel includes first subpixels which are disposed in the sensor area. Second subpixels are disposed in the main area. First driving voltage lines at least partially overlap with the first subpixels and the second subpixels to which first driving voltages are applied. A power supply connecting line is connected to the first driving voltage lines and is disposed in a different layer from the first driving voltage lines.

A display device includes a light-transmitting area. A plurality of subpixels at least partially surrounds the light-transmitting area. First conductive lines are connected to the subpixels. Second conductive lines are connected to the first conductive lines in a wiring area between the light-transmitting area and the subpixels. The first conductive lines are disposed in a different layer from the second conductive lines.

BRIEF DESCRIPTION OF THE DRAWINGS

A more complete appreciation of the present disclosure will become more apparent by describing in detail exemplary embodiments thereof with reference to the accompanying drawings, in which.

DETAILED DESCRIPTION

Figure 1:
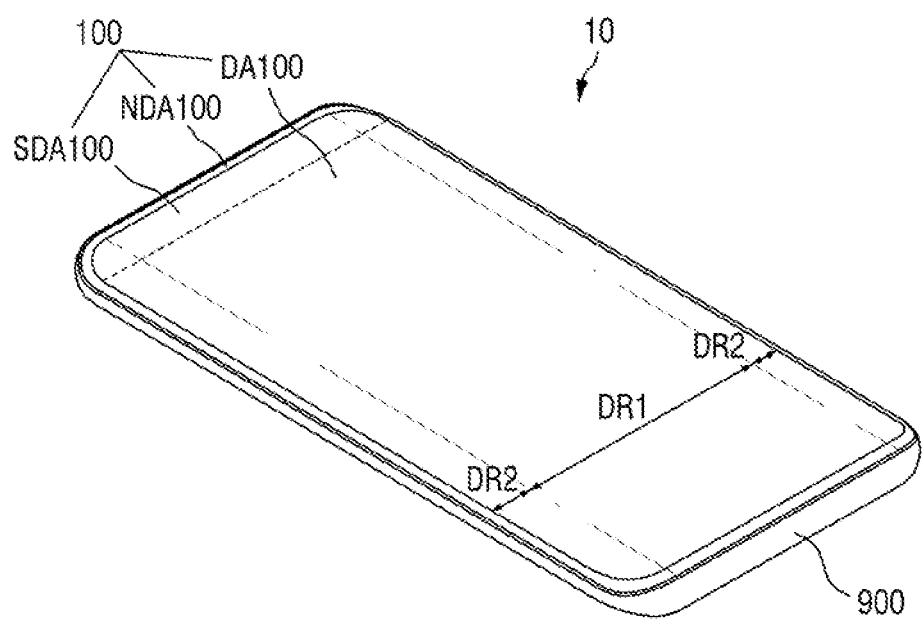
FIG. 1 is a perspective view illustrating a display device according to an exemplary embodiment of the present disclosure.

Exemplary embodiments of the present invention will now be described more fully hereinafter with reference to the accompanying drawings. The present invention may, however, be embodied in different forms and should not be construed as limited exclusively to the exemplary embodiments set forth herein. The same reference numbers may indicate the same or corresponding components throughout the specification and drawings, and thus to the extent that a description of an element may be omitted, it may be assumed that the element is at least similar to corresponding elements that are described elsewhere in the specification. In the attached figures, the size and the thickness of layers and regions may be exaggerated for clarity. Thus, while the relative sizes and thicknesses of layers and regions in the drawings may be illustrative of a particular embodiment, these elements may also be exaggerated for clarity.

It will also be understood that when a layer or element is referred to as being "on" another layer or element, the element or layer can be directly on the other layer or element, or intervening layers or elements may be present.

Hereinafter, exemplary embodiments of the present invention will be described with reference to the attached drawings.

FIG. 1 is a perspective view illustrating a display device according to an exemplary embodiment of the present disclosure.

Figure 2:
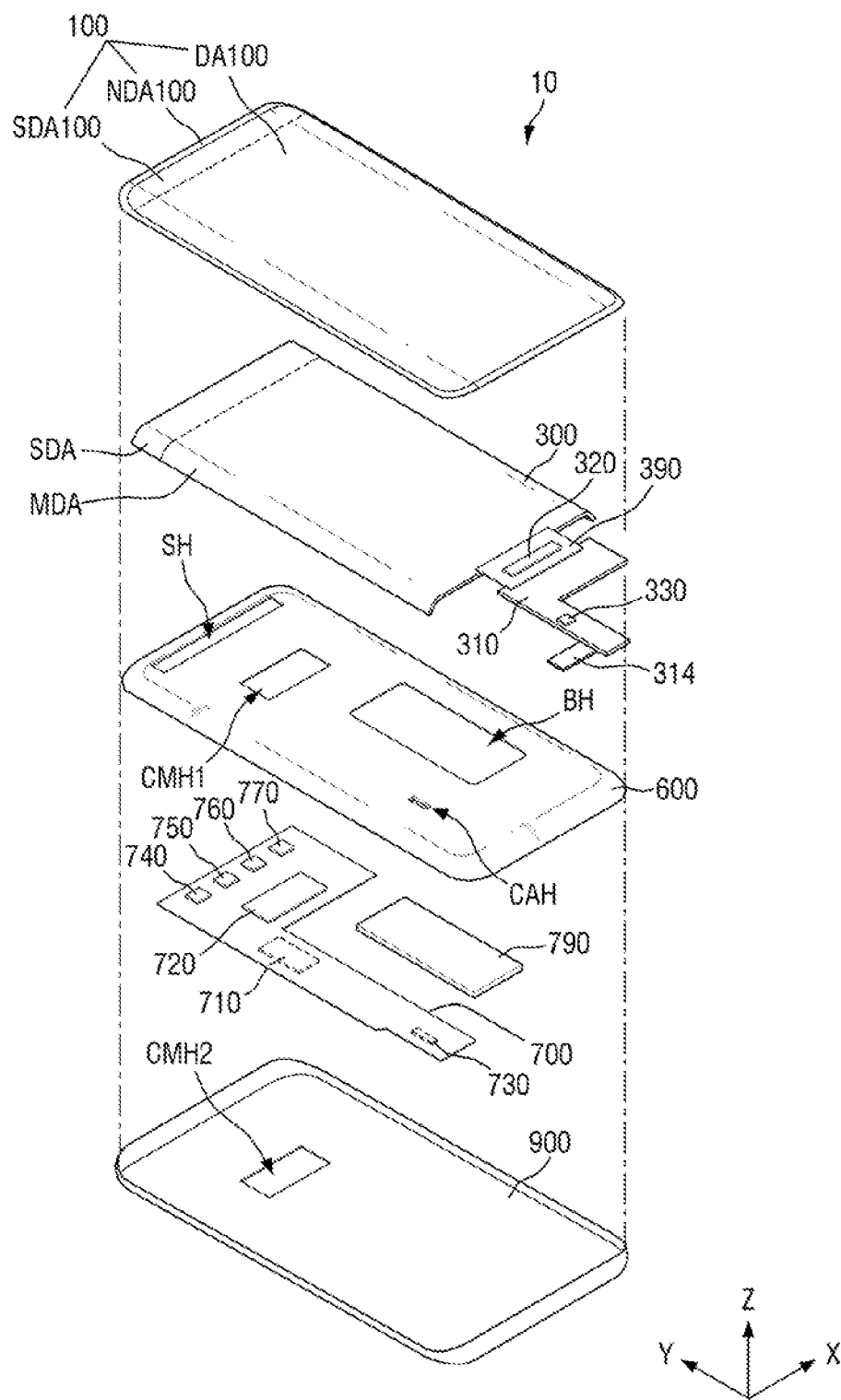
FIG. 2 is an exploded perspective view illustrating the display device of FIG. 1.

Referring to FIGS. 1 and 2, a display device 10 includes a cover window 100, a display panel 300, a display circuit board 310, a display driving circuit 320, a flexible film 390, a bracket 600, a main circuit board 700, sensor devices (740, 750, 760, and 770), and a lower cover/housing 900.

The terms "above", "top", and "top surface", as used herein, denote a direction in which the cover window 100 is disposed with respect to the display panel 300, i.e., a Z-axis direction. The terms "below", "bottom", and "bottom surface", as used herein, denote a direction in which the bracket 600 is disposed with respect to the display panel 300, i.e., the opposite direction of the Z-axis direction. Also, the terms "left", "right", "upper", and "lower", as used herein, denote directions as viewed from above the display panel 300. For example, the term "left" denotes the opposite direction of an X-axis direction, the term "right" denotes the X-axis direction, the term "upper" denotes the Z-axis direction, and the term "lower" denotes the opposite direction of the Z-axis direction.

The display device 10, which is a device for displaying a moving image or a still image, may be used, not only in a portable electronic device such as a mobile phone, a smartphone, a tablet personal computer (PC), a smart watch, a watch phone, a mobile communication terminal, an electronic notebook, an electronic book, a portable multimedia player (PMP), a navigation device, or an ultra-mobile PC (UMPC), but also in various other products such as a television (TV), a notebook/laptop computer, a computer monitor, an electronic billboard, or an Internet-of-Things (IoT) device.

The display device 10 may have a substantially rectangular shape in a plan view. For example, as illustrated in FIGS. 1 and 2, the display device 10 may have a substantially rectangular shape having a pair of short sides extending primarily in a first direction (e.g. the X-axis direction) and a pair of long sides extending primarily in a second direction (e.g. the Y-axis direction). The corners where the short sides and the long sides of the display device 10 meet may be rounded to have a predetermined curvature (so as to form a rounded rectangle) or may be right-angled (so as to form a proper rectangle). The shape of the display device 10 is not particularly limited, and the display device 10 may be formed in various other polygonal shapes or in a circular or elliptical shape.

The display device 10 may include a first region DR1, which is formed to be flat, and second regions DR2, which may have two sections, which extend from the left and right sides of the first region DR1. The second regions DR2 may be flat or curved down the Z-axis. In a case where the second regions DR2 are flat, the angle that the first region DR1 and the second regions DR2 form may be an obtuse angle. In a case where the second regions DR2 are curved, the second regions DR2 may have a uniform or variable curvature.

FIG. 1 illustrates that the second regions DR2 extend from the left and right sides of the first region DR1, but the present disclosure is not limited thereto. Alternatively, the second regions DR2 may extend from only one of the left and right sides of the first region DR1. Yet alternatively, the second regions DR2 may extend not only from the left and right sides, but also from the upper and lower sides, of the first region DR1. For convenience, the second regions DR2 will hereinafter be described as being disposed on the left and right sides of the display device 10.

The cover window 100 may be disposed on the display panel 300 to cover the top surface of the display panel 300. Accordingly, the cover window 100 may protect the top surface of the display panel 300 from impact and contamination.

The cover window 100 may be disposed in the first region DR1 and in the second regions DR2. The cover window 100 may include first and second light-transmitting areas DA100 and SDA100, which correspond to the display panel 300, and a light-blocking area NDA100 which corresponds to an area other than the display panel 300. The second light-transmitting area SDA100 may be disposed on one side of the first light-transmitting area DA100, for example, on the upper side of the first light-transmitting area DA100, as illustrated in FIGS. 1 and 2. The first and second light-transmitting areas DA100 and SDA100 may be disposed in the first region DR1 and in the second regions DR2. The light-transmitting area NDA100 may be opaque. The light-blocking area NDA100 may be a decorative layer that can be seen by a user when no image is displayed.

The display panel 300 may be disposed below the cover window 100. The display panel 300 may be disposed in both the first region DR1 and in the second regions DR2. Accordingly, an image displayed by the display panel 300 can be seen not only in the first region DR1, but also in the second regions DR2. For example, an image displayed by the display panel 300 can be seen not only on the top surface, but also on the left and right edges, of the display device 10 through the cover window 100.

The display panel 300 may include a main area MDA and a sensor area SDA. The main area MDA may be disposed to at least partially overlap with the first light-transmitting area DA100 of the cover window 100. The sensor area SDA may be disposed to at least partially overlap with the second light-transmitting area SDA100 of the cover window 100. The sensor area SDA may be disposed on one side of the main area MDA, e.g., on the upper side of the main area MDA, as illustrated in FIG. 2, but the present disclosure is not limited thereto. For example, the sensor area SDA may be disposed adjacent to corners of the display panel 300 to be at least partially surrounded by the main area MDA. FIG. 2 illustrates that the display panel 300 includes a single sensor area SDA, but the present disclosure is not limited thereto. Alternatively, the display panel 300 may include multiple sensor areas SDA.

The display panel 300 may be a light-emitting display panel including light-emitting elements. For example, the display panel 300 may be an organic light-emitting diode (OLED) display panel using OLEDs, a micro-light-emitting diode (mLED) display panel using mLEDs, a quantum-dot light-emitting diode (QLED) display panel using QLEDs, or an inorganic light-emitting diode (ILED) display panel including an inorganic semiconductor. The display panel 300 will hereinafter be described as being an OLED display panel.

The display circuit board 310 and the display driving circuit 320 may each be attached to one side of the display panel 300. One end of the display circuit board 310 may be attached, via an anisotropic conductive film (ACF), for example, on pads provided on one side of the display panel 300. The display circuit board 310 may be a flexible printed circuit board (FPCB), a rigid printed circuit board (PCB), or a hybrid PCB (e.g. partly flexible and partly rigid).

The display driving circuit 320 receives control signals and power supply voltages via the display circuit board 310 and generates and outputs signals and voltages for driving the display panel 300. The display driving circuit 320 may be an integrated circuit (IC) and may be attached on the display panel 300 in a chip-on-glass (COG) or chip-on-plastic (COP) manner or through ultrasonic bonding, but the present disclosure is not limited thereto. The display driving circuit 320 may be attached on the display circuit board 310.

A touch driving circuit 330 may be disposed on the display circuit board 310. The touch driving circuit 330 may be an IC and may be attached on the top surface of the display circuit board 310. The touch driving circuit 330 may be electrically connected to touch electrodes of a touch sensor layer of the display panel 300 via the display circuit board 310. The touch driving circuit 330 may output touch data, which includes the coordinates of touch input from the user, by applying touch driving signals to some of the touch electrodes of the touch sensor layer, e.g., driving electrodes, and detecting charge variations in the capacitances between the driving electrodes and the other touch electrodes of the touch sensor layer, e.g., sensing electrodes, with the use of the sensing electrodes. A power supply unit 340 of FIG. 3, which is for providing display driving voltages for driving the display driving circuit 320, may be additionally disposed on the display circuit board 310.

One side of the flexible film 390 may be attached on the top surface of the display panel 300, from below the display panel 300, via an ACF. The other side of the flexible film 390 may be attached on the top surface of the display circuit board 310, from above the display circuit board 310, via an ACF. The flexible film 390 may be bendable or foldable.

The flexible film 390 might not be provided, and the display circuit board 310 may be attached directly to one side of the display panel 300. In this case, one side of the display panel 300 may be bent toward the bottom surface of the display panel 300.

The bracket 600 may be disposed below the display panel 300. The bracket 600 may include plastic, a metal, or both. A first camera hole CMH1 in which a first camera sensor 720 is inserted, a cable hole CAH that a cable 314 connected to the display circuit board 310 passes through, and sensor holes SH in which the sensor devices (740, 750, 760, and 770) are each disposed and may each be formed in the bracket 600. Alternatively, the bracket 600 might not include the sensor holes 600 and may be formed so as not to overlap with the sensor area SDA of the display panel 300.

The main circuit board 700 and a battery 790 may each be disposed below the bracket 600. The main circuit board 700 may be a PCB or an FPCB.

The main circuit board 700 may include a main processor 710, the first camera sensor 720, a main connector 730, and the sensor devices (740, 750, 760, and 770). The first camera sensor 720 may be disposed on both the top and bottom surfaces of the main circuit board 700, the main processor 710 may be disposed on the top surface of the main circuit board 700, and the main connector 730 may be disposed on the bottom surface of the main circuit board 700. The sensor devices (740, 750, 760, and 770) may each be disposed on the top surface of the main circuit board 700.

The main processor 710 may control various functions of the display device 10. For example, the main processor 710 may output digital video data to the display driving circuit 320 via the display circuit board 310 so that the display panel 300 can display an image. Also, the main processor 710 may receive touch data from the touch driving circuit 330, may determine the coordinates of touch input from the user, and may execute an application pointed to by an icon displayed at the coordinates of the touch input.

The main processor 710 may control the display device 10 in accordance with sensor signals received from the sensor devices (740, 750, 760, and 770). For example, the main processor 710 may determine whether there is an object in the proximity of the top surface of the display device 10 using a proximity sensor signal received from a proximity sensor 740. In a call mode when the user engages in a call with the use of the display device 10, the main processor 710 might not execute an application pointed to by the coordinates of touch input from the user if there is an object in the proximity of the top surface of the display device 10.

The main processor 710 may determine the brightness at the top surface of the display device 10 in accordance with an illumination sensor signal received from an illumination sensor 750. The main processor 710 may control the luminance of an image displayed by the display panel 10 based on the brightness detected at the top surface of the display device 10.

The main processor 710 may determine whether an iris image from the user is the same as an iris image previously stored in a memory, in accordance with an iris sensor signal received from an iris sensor 760. If the iris image from the user is the same as the iris image previously stored in the memory, the main processor 710 may unlock the display device 10 and may display a home screen on the display panel 300.

The first camera sensor 720 may process a still or moving image obtained by an image sensor and may output the processed image to the main processor 710. The first camera sensor 720 may be a complementary metal-oxide-semiconductor (CMOS) image sensor or a charge-coupled device (CCD) image sensor. Since the first camera sensor 720 is exposed at the bottom surface of the lower cover 900 through a second camera hole CMH2, the first camera sensor 720 can capture an image of an object or a scene at the bottom of the display device 10.

The cable 314, which passes through the cable hole CAH of the bracket 600, may be connected to the main connector 730. As a result, the main circuit board 700 may be electrically connected to the display circuit board 310.

The sensor devices (740, 750, 760, and 770) may include the proximity sensor 740, the illumination sensor 750, the iris sensor 760, and a second camera sensor 770. However, other types of sensor devices may be used.

The proximity sensor 740 is a sensor for determining whether there is an object in the proximity of the top surface of the display device 10. The proximity sensor 740 may include a light source which outputs light and a light receiver which receives light reflected from an object. The proximity sensor 740 may determine whether there is an object in the proximity of the top surface of the display device 10 based on the amount of light reflected from the object. Since the proximity sensor 740 is disposed to at least partially overlap with the sensor holes SH, the sensor area SDA of the display panel 300, and the second light-transmitting area SDA100 of the cover window 100 in the thickness direction of the display panel 300 (e.g. the Z-axis direction), the proximity sensor 740 may generate a proximity sensor signal in accordance with the presence of an object in the proximity of the top surface of the display device 10 and may output the proximity sensor signal to the main processor 710.

The illumination sensor 750 is a sensor for detecting the brightness at the top surface of the display device 10. The illumination sensor 750 may include a resistor whose resistance varies in accordance with the brightness of incident light. The illumination sensor 750 may determine the brightness at the top surface of the display device 10 based on a variation in the resistance of the resistor caused by the brightness of the incident light. Since the illumination sensor 750 is disposed to at least partially overlap with the sensor holes SH, the sensor area SDA of the display panel 300, and the second light-transmitting area SDA100 of the cover window 100 in the thickness direction of the display panel 300 (e.g. the Z-axis direction), the illumination sensor 750 may generate an illumination sensor signal in accordance with the brightness at the top surface of the display device 10 and may output the illumination sensor signal to the main processor 710.

The iris sensor 760 is a sensor for determining whether an image of the user's iris is the same as the iris image previously stored in the memory. The iris sensor 760 may generate an iris sensor signal in accordance with whether the image of the user's iris is the same as the iris image previously stored in the memory, and may output the iris sensor signal to the main processor 710.

The second camera sensor 770 may process a still or moving image obtained by an image sensor and may output the processed image to the main processor 710. The second camera sensor 770 may be a CMOS image sensor or a CCD image sensor. The number of pixels of the first camera sensor 770 may be smaller than the number of pixels of the first camera sensor 720, and the size of the second camera sensor 770 may be smaller than the size of the first camera sensor 720. Since the second camera sensor 770 is disposed to at least partially overlap with the sensor holes SH, the sensor area SDA of the display panel 300, and the second light-transmitting area SDA100 of the cover window 100 in the thickness direction of the display panel 300 (e.g. the Z-axis direction), the second camera sensor 770 can capture an image of an object or the background at the top of the display device 10.

The battery 790 may be disposed so as not to overlap with the main circuit board 700 in the third direction (e.g. the Z-axis direction). The battery 790 may at least partially overlap with a battery hole BH of the bracket 600.

A mobile communication module, which can exchange wireless signals with a base station, an external terminal, and/or a server, via a mobile communication network, may be further provided on the main circuit board 700. The wireless signals may include various types of data associated with the transmission/reception of audio signals, video call signals, or text/multimedia messages.

The lower cover 900 may be disposed below the main circuit board 700 and the battery 790. The lower cover 900 may be coupled and fixed to the bracket 600. The lower cover 900 may form the bottom exterior of the display device 10. The lower cover 900 may include plastic, a metal, or both.

A second camera hole CMH2, through which the bottom surface of the first camera sensor 720 is exposed, may be formed in the lower cover 900. The locations of the first camera sensor 720 and the first and second camera holes CMH1 and CMH2, which correspond to the first camera sensor 720, are not particularly limited.

Figure 3:
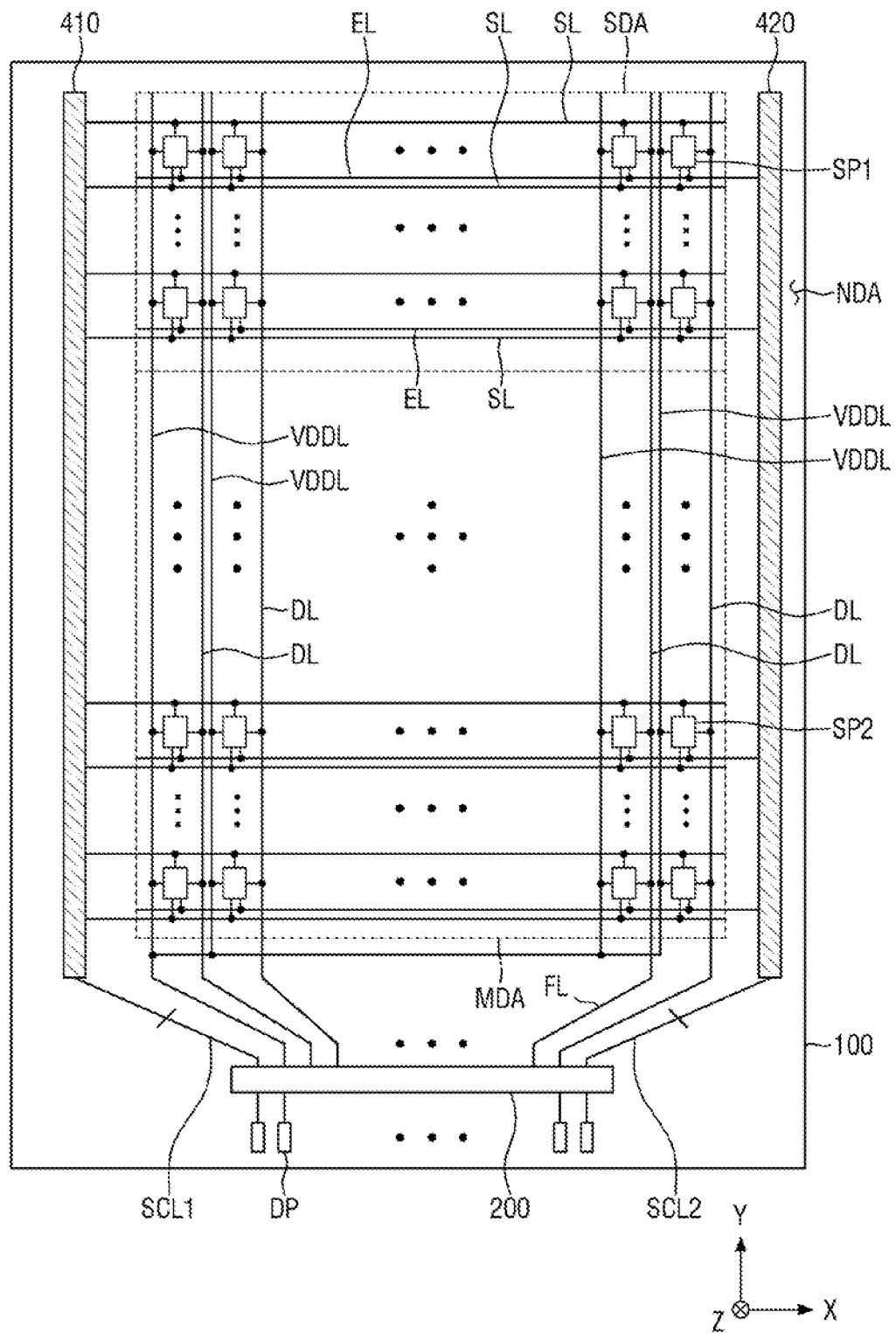
FIG. 3 is a plan view illustrating a display panel of the display device of FIG. 1.
Figure 4:
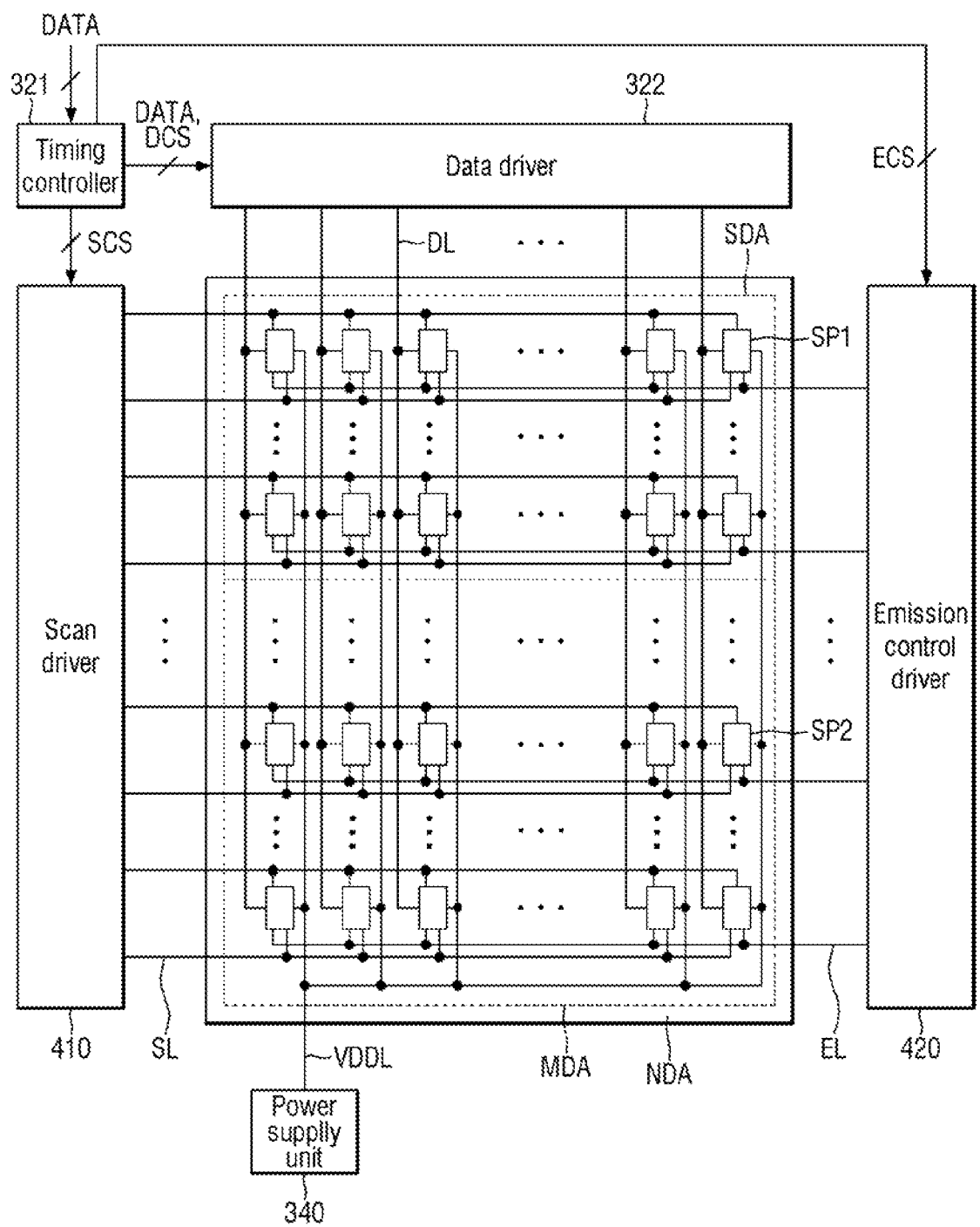
FIG. 4 is a block diagram illustrating the display panel and a display driving circuit of the display device of FIG. 1.

FIG. 3 is a plan view illustrating the display panel of the display device of FIG. 1. FIG. 4 is a block diagram illustrating the display panel and the display driving circuit of the display device of FIG. 1.

Referring to FIGS. 3 and 4, the display panel 300 may include the sensor area SDA, which includes first subpixels SP1, the main area MDA, which includes second subpixels SP2, and the non-display area NDA, which includes neither the first subpixels SP1 nor the second subpixels SP2. The first subpixels SP1 and the second subpixels SP2 may be disposed in the sensor area SDA and the main area MDA along with scan lines SL, emission lines ECL, data lines DL, and first driving voltage lines VDDL, which are connected to the first subpixels SP1 and the second subpixels SP2. The scan lines SL and the emission lines ECL may extend primarily in the first direction (e.g. the X-axis direction), and the data lines DL may extend primarily in the second direction (e.g. the Y-axis direction), which intersects the first direction (e.g. the X-axis direction). In the display area DA, the first driving voltage lines VDDL may extend primarily in the second direction (e.g. the Y-axis direction). The first driving voltage lines VDDL may be connected to one another in the non-display area NDA.

The first subpixels SP1 and the second subpixels SP2 may each be connected to at least one of the scan lines SL, at least one of the emission lines ECL, and one of the first driving voltage lines VDDL. For convenience, FIGS. 3 and 4 illustrate that the first subpixels SP1 and the second subpixels SP2 are each connected to two scan lines SL, one data line DL, one emission line ECL, and one first driving voltage line VDDL, but the present disclosure is not limited thereto. Alternatively, each of the second subpixels SP2 may be connected to three scan lines SL.

The first subpixels SP1 and the second subpixels SP2 may each include a driving transistor, one or more transistors ST, a light-emitting element, and capacitors. The driving transistor may emit light by providing a driving current to the light-emitting element in accordance with a data voltage applied to the gate electrode thereof. The driving transistor and the transistors may be thin-film transistors (TFTs). The light-emitting element may emit light in accordance with the driving current provided thereto by the driving transistor. The light-emitting element may be an OLED including a first electrode, an organic light-emitting layer, and a second electrode. The capacitors may uniformly maintain the data voltage applied to the gate electrode of the driving transistor.

The non-display area NDA may be defined as an area on the display panel 300, other than the main area MDA and the sensor area SDA. The non-display area NDA may therefore not include any subpixels. The scan driving circuit 400, which applies scan signals to the scan lines SL, fan-out lines FL, which connect the data lines DL, the display driving circuit 320, and pads DP, which are connected to the display driving circuit 320, may each be disposed in the non-display area NDA. The display driving circuit 320 and the pads DP may be disposed on one side of the display panel 300. The pads DP may be disposed closer than the display driving circuit 320 to one side of the display panel 300.

The scan driver 410 may be connected to the display driving circuit 320 via a plurality of first scan control lines SCL1. The scan driver 410 may receive scan control signals SCS from the display driving circuit 320 via the first scan control lines SCL1. The scan driver 410 may generate scan signals in accordance with the scan control signals SCS and may sequentially output the scan signals to the scan lines SL.

An emission control driver 420 may be connected to the display driving circuit 320 via a plurality of second scan control lines SCL2. The emission control driver 420 may receive emission control signals ECS from the display driving circuit 320 via the second scan control lines SCL2. The emission control driver 420 may generate emission control signals in accordance with the emission control signals ECS and may sequentially output the emission control signals to the emission lines ECL.

As illustrated in FIG. 3, the scan driver 410 may be disposed on one side of each of the main area MDA and the sensor area SDA, and the emission control driver 420 may be disposed on the other side of each of the main area MDA and the sensor area SDA. Alternatively, the scan driver 410 and the emission control driver 420 may both be disposed on the other side of each of the main area MDA and the sensor area SDA.

The scan driver 410 may include a plurality of TFTs for generating scan signals in accordance with the scan control signals SCS, and the emission control driver 420 may include a plurality of TFTs for generating emission control signals in accordance with the emission control signals ECS. In this case, the TFTs of the scan driver 410 and the TFTs of the emission control driver 420 may be formed in the same layer as the TFTs of each of the first subpixels SP1 and the TFTs of each of the second subpixels SP2.

The display driving circuit 320 may include a timing controller 321 and a data driver 322, as illustrated in FIG. 4

The timing controller 321 may receive digital video data DATA and timing signals from the display circuit board 310. The timing controller 321 may generate the scan control signals SCS, which are for controlling the operation timing of the scan driver 410 in accordance with the timing signals, may generate the emission control signals ECS, which are for controlling the operation timing of the emission control driver 420, and the data control signals DCS, which are for controlling the operation timing of the data driver 322. The timing controller 321 may output the scan control signals SCS to the scan driver 410 via a plurality of scan control lines SCL and may output the emission control signals ECS to the emission control driver 420. The timing controller 321 may output the digital video data DATA and the data control signals DCS to the data driver 322.

The data driver 322 may convert the digital video data DATA into positive/negative analog data voltages and may output the analog data voltages to the data lines DL via the fan-out lines FL. Subpixels SP may be selected by the scan signals from the scan driving circuit 400, and data voltages may be provided to the selected subpixels SP.

The power supply unit 340 may generate a first driving voltage and may provide the first driving voltage to the first driving voltage lines VDDL. Also, the power supply unit 340 may generate a second driving voltage and may provide the second driving voltage to the cathode electrodes of the OLEDs of the first subpixels SP1 and to the cathode electrodes of the OLEDs of the second subpixels SP2. The first driving voltage may be a high-potential voltage for driving OLEDs, and the second driving voltage may be a low-potential voltage for driving the OLEDs. For example, the first driving voltage may have a higher potential than the second driving voltage. The power supply unit 340 may generate driving voltages for driving the display driving circuit 320 and the scan driving circuit 400, e.g., a display driving voltage, a gate-high voltage, a gate-low voltage, and the like, and may provide the generated driving voltages to the display driving circuit 320.

The display driving circuit 320 may be an IC and may be attached on the display panel 300 in a COG or COP manner or through ultrasonic bonding, but the present disclosure is not limited thereto. For example, the display driving circuit 320 may be attached on the display circuit board 310.

Figure 5:
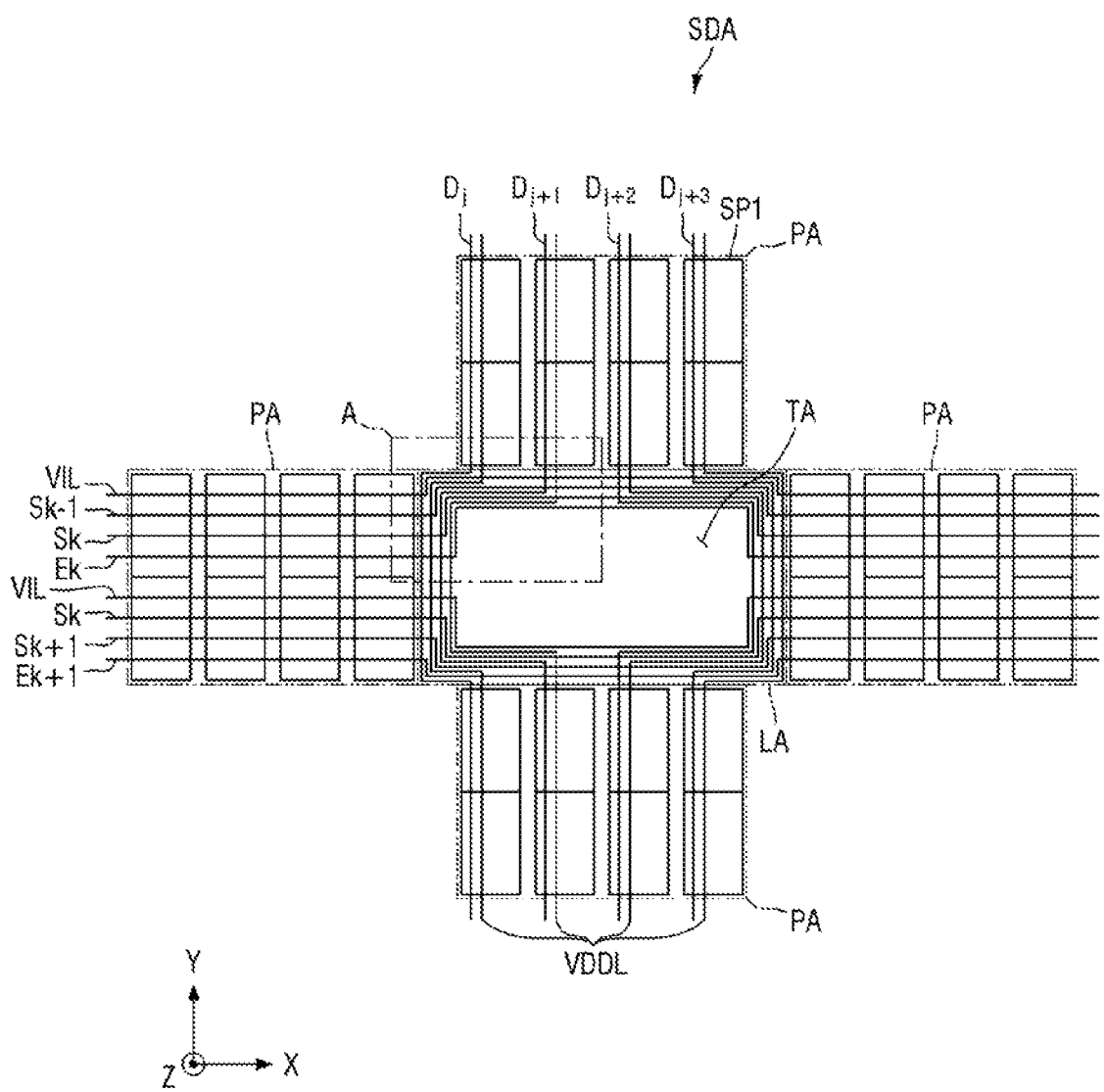
FIG. 5 is a plan view illustrating first subpixels, scan lines, data lines, and first driving voltage lines in a sensor area of the display device of FIG. 1.
Figure 6:
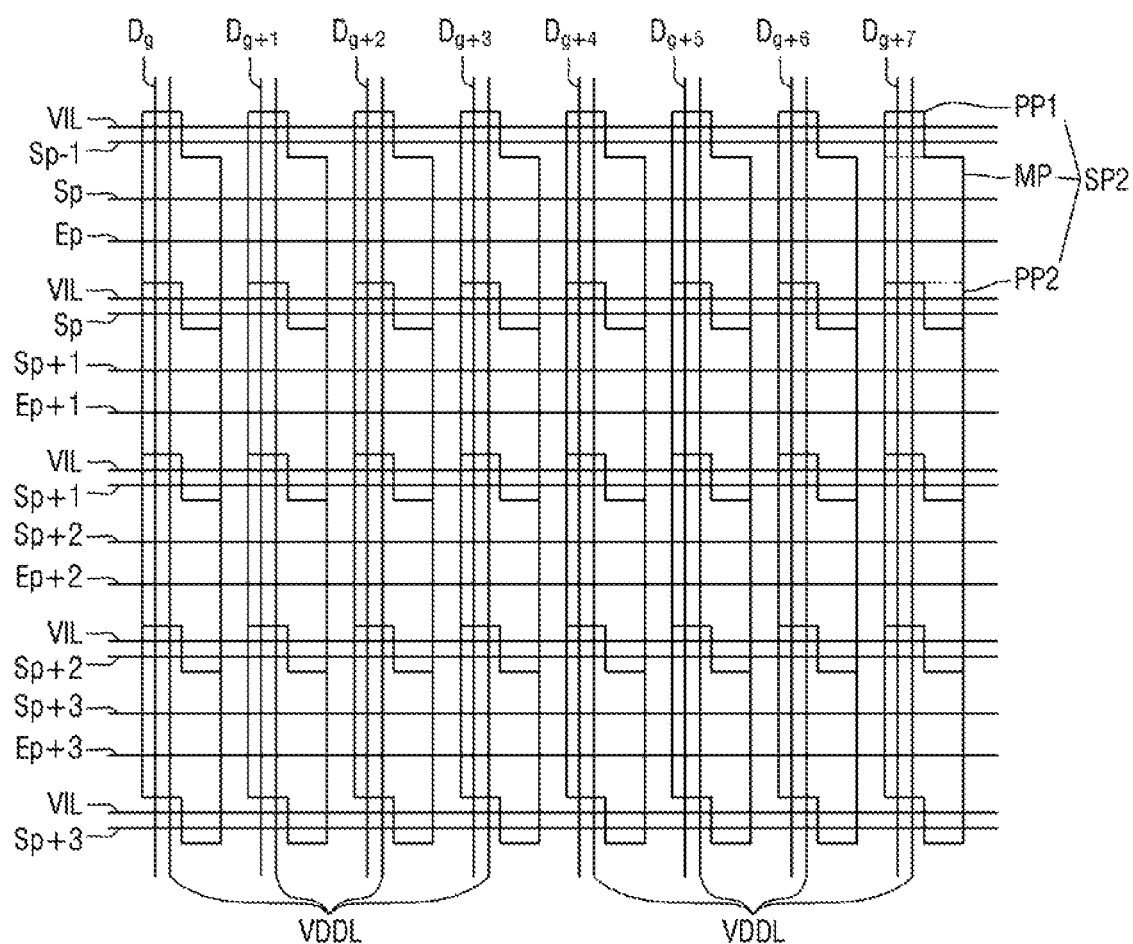
FIG. 6 is a plan view illustrating second subpixels, scan lines, data lines, and first driving voltage lines in a main area of the display device of FIG. 1.

FIG. 5 is a plan view illustrating the first subpixels, the scan lines, the data lines, and the first driving voltage lines in the sensor area of the display device of FIG. 1. FIG. 6 is a plan view illustrating the second subpixels, the scan lines, the data lines, and the first driving voltage lines in the main area of the display device of FIG. 1.

For convenience, FIG. 5 illustrates (k−1)-, k-, and (k+1)-th scan lines Sk−1, Sk, and Sk+1 (where k is an integer of 2 or greater), j-, (j+1)-, (j+2)-, and (j+3)-th data lines $D_j$, $D_{j+1}$, $D_{j+2}$, and $D_{j+3}$ (where j is a positive integer), and k- and (k+1)-th emission lines Ek and Ek+1.

Also, for convenience, FIG. 6 illustrates (p−1)-, p-, (p+1)-, (p+2)-, and (p+3)-th scan lines Sp−1, Sp, Sp+1, Sp+2, Sp+3 (where p is an integer of 2 or greater), g-, (g+1)-, (g+2)-, (g+3)-, (g+4)-, (g+5)-, (g+6)-, and (g+7)-th data lines $D_g$, $D_{g+1}$, $D_{g+2}$, $D_{g+3}$, $D_{g+4}$, $D_{g+5}$, $D_{g+6}$, and $D_{g+7}$ (where g is a positive integer), and p-, (p+1)-, (p+2)-, and (p+3)-th emission lines Ep, Ep+1, Ep+2, and Ep+3.

Referring to FIGS. 5 and 6, the sensor area SDA includes the first subpixels SP1 and a light-transmitting area TA which is at least partially surrounded by the first subpixels SP. The main area MDA includes the second subpixels SP2. The main area MDA does not include the light-transmitting area TA. Due to the presence of the light-transmitting area TA, the number of first subpixels SP1 in the sensor area SDA may be smaller than the number of second subpixels SP2 in the main area MDA.

In a plan view, each of the first subpixels SP1 may have a substantially rectangular shape having a pair of short sides extending primarily in the first direction (e.g. the X-axis direction) and a pair of long sides extending primarily in the second direction (e.g. the Y-axis direction). In a plan view, each of the first subpixels SP1 may have a substantially square shape, as illustrated in FIG. 5, but the present disclosure is not limited thereto.

Each of the second subpixels SP2 may include a main pixel portion MP, a first protruding pixel portion PP1, and a second protruding pixel portion PP2. In a plan view, the main pixel portion MP may have a substantially rectangular shape having a pair of short sides extending primarily in the first direction (e.g. the X-axis direction) and a pair of long sides extending primarily in the second direction (e.g. the Y-axis direction). The first and second protruding pixel portions PP1 and PP2 may have a substantially rectangular shape in a plan view. The first protruding pixel portion PP1 may protrude from the upper side of the main pixel portion MP, and the second protruding pixel portion PP2 may protrude from the lower side of the main pixel portion MP. Specifically, the first protruding pixel portion PP1 may protrude from a portion of the upper side of the main pixel portion MP adjacent to the left side of the main pixel portion MP, and the second protruding pixel portion PP2 may protrude from a portion of the lower side of the main pixel portion MP adjacent to the right side of the main pixel portion MP.

In the sensor area SDA, particularly, in a pixel area PA that at least partially overlaps with the first subpixels SP1, initialization voltage lines VIL, the (k−1)-, k-, and (k+1)-th scan lines Sk−1, Sk, and Sk+1, and the k- and (k+1)-th emission lines Ek and Ek+1 may extend primarily in the first direction (e.g. the X-axis direction). In the pixel area PA of the sensor area SDA, the first driving voltage lines VDDL, the j-, (j+1)-, (j+2)-, and (j+3)-th data lines $D_j$, $D_{j+1}$, $D_{j+2}$, and $D_{j+3}$ may extend primarily in the second direction (e.g. the Y-axis direction).

In the main area MDA, the initialization voltage lines VIL, the (p−1)-, p-, (p+1)-, (p+2)-, and (p+3)-th scan lines Sp−1, Sp, Sp+1, Sp+2, Sp+3, and the p-, (p+1)-, (p+2)-, and (p+3)-th emission lines Ep, Ep+1, Ep+2, and Ep+3 may extend primarily in the first direction (e.g. the X-axis direction). In the main area MDA, the first driving voltage lines VDDL and the g-, (g+1)-, (g+2)-, (g+3)-, (g+4)-, (g+5)-, (g+6)-, and (g+7)-th data lines $D_g$, $D_{g+1}$, $D_{g+2}$, $D_{g+3}$, $D_{g+4}$, $D_{g+5}$, $D_{g+6}$, and $D_{g+7}$ may extend primarily in the second direction (e.g. the Y-axis direction).

Each of the first subpixels SP1 may at least partially overlap with one initialization voltage line VIL, two scan lines SL, and one emission line ECL. For example, each of the first subpixels SP1 may at least partially overlap with four lines that are arranged in the first direction (e.g. the X-axis direction).

Each of the second subpixels SP2 may at least partially overlap with two initialization voltage lines VIL, three scan lines SL, and one emission line ECL. For example, each of the second subpixels SP2 may at least partially overlap with six lines that are arranged in the first direction (e.g. the X-axis direction).

Figure 7:
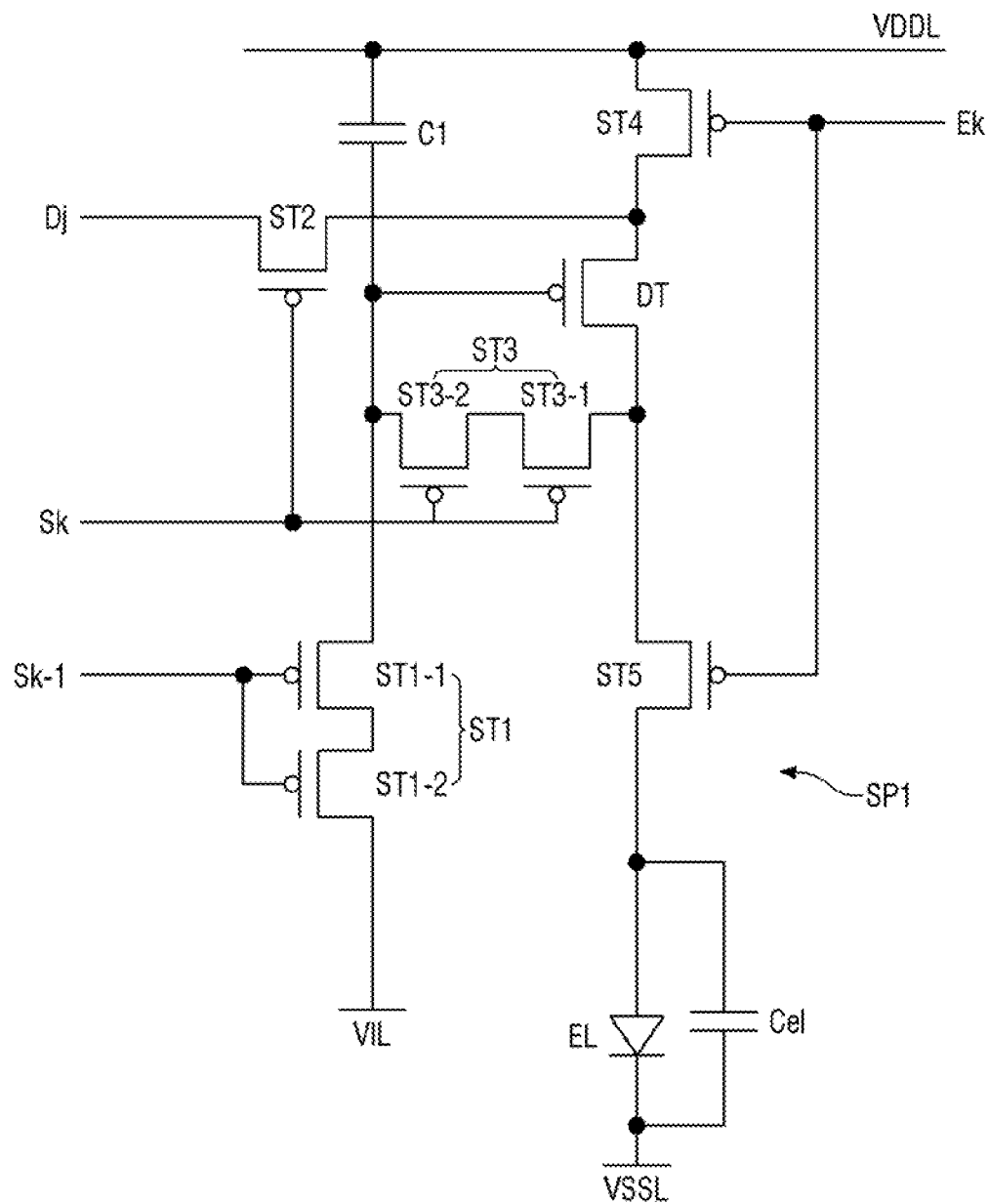
FIG. 7 is a circuit diagram illustrating an exemplary first subpixel.
Figure 8:
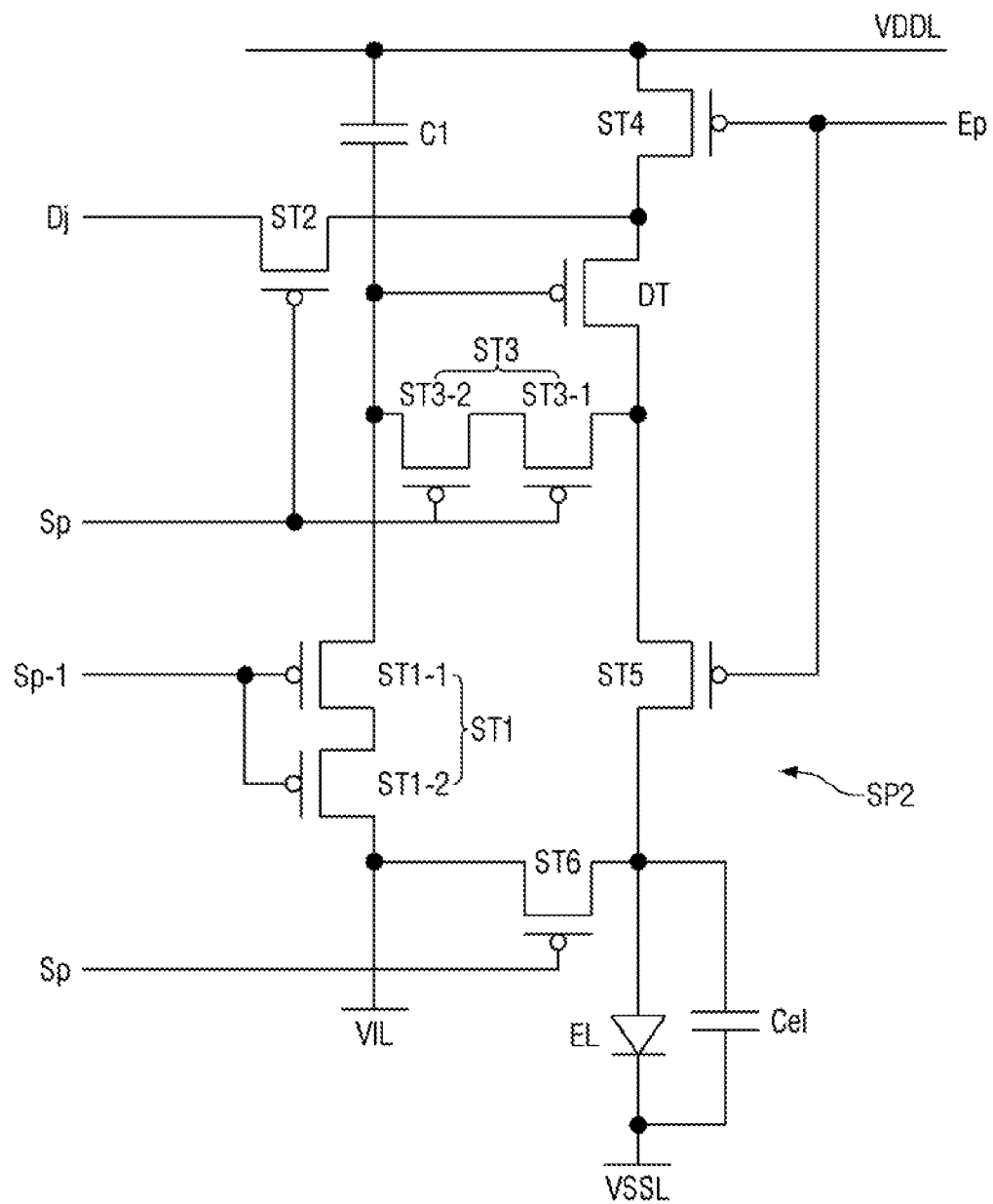
FIG. 8 is a circuit diagram illustrating an exemplary second subpixel.

The number of transistors provided in each of the first subpixels SP1 may be smaller than the number of transistors provided in each of the second subpixels SP2, as illustrated in FIGS. 7 and 8. Thus, the number of lines arranged in the first direction (e.g. the X-axis direction) to at least partially overlap with each of the first subpixels SP1 may be smaller than the number of lines arranged in the first direction (e.g. the X-axis direction) to at least partially overlap with each of the second subpixels SP2.

The first subpixels SP1 and the second subpixels SP2 may each at least partially overlap with one data line and one first driving voltage line VDDL. For example, the first subpixels SP1 and the second subpixels SP2 may each at least partially overlap with two lines arranged in the second direction (e.g. the Y-axis direction).

The light-transmitting area TA may be at least partially surrounded by the first subpixels SP1. FIG. 5 illustrates that the light-transmitting area TA has a substantially rectangular shape in a plan view, but the present disclosure is not limited thereto. Alternatively, the light-transmitting area TA may have a shape other than a substantially rectangular shape, such as, for example, another polygonal shape, a circular shape, an elliptical shape, or an amorphous shape.

A wiring area LA may be disposed between the light-transmitting area TA and the first subpixels SP1. The wiring area LA may be disposed to at least partially surround the light-transmitting area TA.

As the size of the wiring area LA decreases, the size of the light-transmitting area TA increases. Accordingly, the distance between each pair of adjacent lines among the initialization voltage lines VIL, the (k−1)-, k-, and (k+1)-th scan lines Sk−1, Sk, and Sk+1, and the k- and (k+1)-th emission lines Ek and Ek+1 may be smaller in the wiring area LA than in the pixel area PA. Also, the distance between each pair of adjacent lines among the first driving voltage lines VDDL and the j-, (j+1)-, (j+2)-, and (j+3)-th data lines $D_j$, $D_{j+1}$, $D_{j+2}$, and $D_{j+3}$ may be smaller in the wiring area LA than in the pixel area PA.

The initialization voltage lines VIL, the (k−1)-, k-, and (k+1)-th scan lines Sk−1, Sk, and Sk+1, and the k- and (k+1)-th emission lines Ek and Ek+1 may be bent at least once in the wiring area LA. For example, the initialization voltage lines VIL, the (k−1)-, k-, and (k+1)-th scan lines Sk−1, Sk, and Sk+1, and the k- and (k+1)-th emission lines Ek and Ek+1 may be bent four times in the wiring area LA.

The first driving voltage lines VDDL and the j-, (j+1)-, (j+2)-, and (j+3)-th data lines $D_j$, $D_{j+1}$, $D_{j+2}$, and $D_{j+3}$ may be bent at least once in the wiring area LA. For example, the first driving voltage lines VDDL and the j-, (j+1)-, (j+2)-, and (j+3)-th data lines $D_j$, $D_{j+1}$, $D_{j+2}$, and $D_{j+3}$ may be bent four times in the wiring area LA.

The initialization voltage lines VIL, the (k−1)-, k-, and (k+1)-th scan lines Sk−1, Sk, and Sk+1, and the k- and (k+1)-th emission lines Ek and Ek+1 may each at least partially overlap with at least one of the following lines: the first driving voltage lines VDDL and the j-, (j+1)-, (j+2)-, and (j+3)-th data lines $D_j$, $D_{j+1}$, $D_{j+2}$, and $D_{j+3}$. The first driving voltage lines VDDL and the j-, (j+1)-, (j+2)-, and (j+3)-th data lines $D_j$, $D_{j+1}$, $D_{j+2}$, and $D_{j+3}$ may each at least partially overlap with at least one of the following lines: the initialization voltage lines VIL, the (k−1)-, k-, and (k+1)-th scan lines Sk−1, Sk, and Sk+1, and the k- and (k+1)-th emission lines Ek and Ek+1.

According to the structures illustrated in FIGS. 5 and 6, since the sensor area SDA of the display panel 300 includes the light-transmitting area TA, light can be incident upon the sensor devices (740, 750, 760, and 770), which are disposed on the bottom surface of the display panel 300, from the top surface of the display device 10 through the light-transmitting area TA, even if the sensor devices (740, 750, 760, and 770) are disposed to at least partially overlap with the sensor area SDA in the thickness direction of the display panel 300, i.e., in the third direction (e.g. the Z-axis direction). Therefore, the degradation of the sensing capabilities of the sensor devices (740, 750, 760, and 770) can be prevented or reduced.

FIG. 7 is a circuit diagram of an exemplary first subpixel. Specifically, FIG. 7 illustrates a first subpixel SP1 connected to the (k−1)- and k-th scan lines Sk−1 and Sk and the j-th data line $D_j$.

Referring to FIG. 7, the first subpixel SP1 may at least partially overlap with the (k−1)- and k-th scan lines Sk−1 and Sk and the j-th data line $D_j$. Also, the first subpixel SP1 may be connected to a first driving voltage line VDDL to which the first driving voltage is provided, an initialization voltage line VIL to which an initialization voltage Vini is provided, and a second driving voltage line VSSL to which the second driving voltage is provided.

The first subpixel SP1 includes a driving transistor DT, a light-emitting element EL, switching elements, a first capacitor C1, and a second capacitor C2. The switching elements may include first, second, third, fourth, and fifth transistors ST1, ST2, ST3, ST4, and ST5.

The driving transistor DT may include a gate electrode DT_G, a first electrode, and a second electrode. The driving transistor DT controls a drain-source current Ids (hereinafter, the driving current Ids) in accordance with a data voltage applied to the gate electrode DT_G. The driving current Ids, which flows through the channel of the driving transistor DT, is proportional to the square of the difference between a threshold voltage and a voltage Vgs between the gate electrode DT_G and a source electrode of the driving transistor DT, as shown in Equation (1):

$$Ids = k' \times (Vgs - Vth)^2$$

where k' denotes a proportional coefficient determined by the structure and the physical characteristics of the driving transistor DT, Vgs denotes the gate-source voltage of the driving transistor DT, and Vth denotes the threshold voltage of the driving transistor DT.

The light-emitting element EL emits light in accordance with the driving current Ids. The amount of light emitted by the light-emitting element EL may be proportional to the driving current Ids.

The light-emitting element EL may be an OLED including an anode electrode, a cathode electrode, and an organic light-emitting layer, which is disposed between the anode electrode and the cathode electrode. Alternatively, the light-emitting element EL may be an ILED including an anode electrode, a cathode electrode, and an inorganic semiconductor, which is disposed between the anode electrode and the cathode electrode. Yet alternatively, the light-emitting element EL may be a QLED including an anode electrode, a cathode electrode, and a quantum-dot light-emitting layer, which is disposed between the anode electrode and the cathode electrode. Yet still alternatively, the light-emitting element EL may be an mLED.

The anode electrode of the light-emitting element EL may be connected to a second electrode of the fifth transistor ST5, and the cathode electrode of the light-emitting element EL may be connected to the second driving voltage line VSSL. Parasitic capacitance Cel may be formed between the anode electrode and the cathode electrode of the light-emitting element EL.

The first transistor ST1 may be a dual transistor including (1-1)- and (1-2)-th transistors ST1-1 and ST1-2. The (1-1)- and (1-2)-th transistors ST1-1 and ST1-2 are turned on by a scan signal from the (k−1)-th scan line Sk−1 to connect the gate electrode of the driving transistor DT and the initialization voltage line VIL. The gate electrode of the driving transistor DT may be discharged to as low as the initialization voltage Vini of the initialization voltage line VL. The gate electrode of the (1-1)-th transistor ST1-1 may be connected to the (k−1)-th scan line Sk−1, the first electrode of the (1-1)-th transistor ST1-1 may be connected to the gate electrode of the driving transistor DT, and the second electrode of the (1-1)-th transistor ST1-1 may be connected to the first electrode of the (1-2)-th transistor ST1-2. The gate electrode of the (1-2)-th transistor ST1-2 may be connected to the (k−1)-th scan line Sk−1, the first electrode of the (1-2)-th transistor ST1-2 may be connected to the second electrode of the (1-1)-th transistor ST1-1, and the second electrode of the (1-2)-th transistor ST1-2 may be connected to the initialization voltage line VIL.

The second transistor ST2 is turned on by a scan signal from the k-th signal Sk to connect the first electrode of the driving transistor DT and the j-th data line D$_j$. The gate electrode of the second transistor ST2 may be connected to the k-th scan line Sk, the first electrode of the second transistor ST2 may be connected to the first electrode of the driving transistor DT, and the second electrode of the second transistor ST2 may be connected to the j-th data line D$_j$.

The third transistor ST3 may be a dual transistor including (3-1)- and (3-2)-th transistors ST3-1 and ST3-2. The (3-1)- and (3-2)-th transistors ST3-1 and ST3-2 are turned on by the scan signal from the (k−1)-th scan line Sk−1 to connect the gate electrode and the second electrode of the driving transistor DT. For example, when the (3-1)- and (3-2)-th transistors ST3-1 and ST3-2 are turned on, the gate electrode and the second electrode of the driving transistor DT are connected, and as a result, the driving transistor DT operates as a diode. The gate electrode of the (3-1)-th transistor ST3-1 may be connected to the k-th scan line Sk, the first electrode of the (3-1)-th transistor ST3-1 may be connected to the second electrode of the driving transistor DT, and the second electrode of the (3-1)-th transistor ST3-1 may be connected to the first electrode of the (3-2)-th transistor ST3-2. The gate electrode of the (3-2)-th transistor ST3-2 may be connected to the k-th scan line Sk, the first electrode of the (3-2)-th transistor ST3-2 may be connected to the second electrode of the (3-1)-th transistor ST3-1, and the second electrode of the (3-2)-th transistor ST3-2 may be connected to the gate electrode of the driving transistor DT.

The fourth transistor ST4 is turned on by an emission control signal from the k-th emission line Ek to connect the first electrode of the driving transistor DT and the first driving voltage line VDDL. The gate electrode of the fourth transistor ST4 may be connected to the k-th emission line Ek, the first electrode of the fourth transistor ST4 may be connected to the first driving voltage line VDDL, and the second electrode of the fourth transistor ST4 may be connected to the source electrode of the driving transistor DT.

The fifth transistor ST5 is connected between the second electrode of the driving transistor DT and the anode electrode of the light-emitting element EL. The fifth transistor ST5 is turned on by the emission control signal from the k-th emission line Ek to connect the second electrode of the driving transistor DT and the anode electrode of the light-emitting element EL. The gate electrode of the fifth transistor ST5 is connected to the k-th emission line Ek, the first electrode of the fifth transistor ST5 is connected to the second electrode of the driving transistor DT, and the second electrode of the fifth transistor ST5 is connected to the anode electrode of the light-emitting element EL. When the fourth and fifth transistors ST4 and ST5 are both turned on, the driving current Ids may be provided to the light-emitting element EL.

The first capacitor C1 is formed between the second electrode of the driving transistor DT and the first driving voltage line VDDL. The first electrode of the first capacitor C1 may be connected to the second electrode of the driving transistor DT, and the second electrode of the first capacitor C2 may be connected to the first driving voltage line VDDL.

In a case where the first electrodes of the first through fifth transistors ST1 through ST5 and the first electrode of the driving transistor DT are source electrodes, the second electrodes of the first through fifth transistors ST1 through ST5 and the second electrode of the driving transistor DT may be drain electrodes. In a case where the first electrodes of the first through fifth transistors ST1 through ST5 and the first electrode of the driving transistor DT are drain electrodes, the second electrodes of the first through fifth transistors ST1 through ST5 and the second electrode of the driving transistor DT may be source electrodes.

The first through fifth transistors ST1 through ST5 and the driving transistor DT may be formed of one of polysilicon, amorphous silicon, or an oxide semiconductor. In a case where the first through fifth transistors ST1 through ST5 and the driving transistor DT are formed of polysilicon, the first through fifth transistors ST1 through ST5 and the driving transistor DT may be formed by a low-temperature polysilicon (LTPS) process.

FIG. 7 illustrates that the first through fifth transistors ST1 through ST5 and the driving transistor DT are P-type metal-oxide-semiconductor field-effect transistors (MOSFETs), but the present disclosure is not limited thereto. Alternatively, the first through fifth transistors ST1 through ST5 and the driving transistor DT are N-type MOSFETs.

FIG. 8 is a circuit diagram of an exemplary second subpixel. Specifically, FIG. 8 illustrates a second subpixel SP2 connected to the (p−1)- and p-th scan line Sp−1 and Sp and the g-th data line $D_g$.

The second subpixel SP2 of FIG. 8 differs from the first subpixel SP1 of FIG. 7 in that it further includes a sixth transistor ST6. The second subpixel SP2 of FIG. 8 will hereinafter be described, focusing mainly on the differences with the first subpixel SP1 of FIG. 7. It will therefore be assumed that to the extent that certain details concerning the second subpixel SP2 are not described below, these details may be at least similar to corresponding details concerning the first subpixel SP1 described herein.

Referring to FIG. 8, the sixth transistor ST6 is turned on by a scan signal from the p-th scan line Sp to connect the anode electrode of a light-emitting element EL and an initialization voltage line VIL. The anode electrode of the light-emitting element may be discharged to as low as an initialization voltage Vini of the initialization voltage line VIL. The gate electrode of the sixth transistor ST6 is connected to the p-th scan line Sp, the first electrode of the sixth transistor ST6 is connected to the anode electrode of the light-emitting element EL, and the second electrode of the sixth transistor ST6 is connected to the initialization voltage line VIL.

According to the embodiment of FIGS. 7 and 8, each of the first subpixels SP includes six transistors, and each of the second subpixel SP2 includes seven transistors. For example, the number of transistors provided in each of the first subpixel SP1 may be smaller than the number of transistors provided in each of the second subpixel SP2. Accordingly, the wiring area LA can be provided in a region where the sixth transistors ST6 are not provided, and as a result, the light-transmitting area TA can be widened.

The sixth transistors ST6 of the second subpixels SP2 lower the voltage at the anode electrodes of the light-emitting elements EL to as low as the initialization voltage Vini. Thus, when the light-emitting elements EL display black, the sixth transistors ST6 of the second subpixels SP2 can prevent black from becoming visible to the user during a period when the fifth transistors ST5 of the second subpixels SP2 are turned off. However, since the period when the fifth transistors ST5 of the second subpixels SP2 are turned off is very short and the number of first subpixels SP1 provided in the sensor area SDA is smaller than the number of second subpixels SP2 provided in the main area MDA, the black becomes barely visible to the user. Accordingly, the sixth transistors ST6 might not be provided in the first subpixels SP1.

Figure 9:
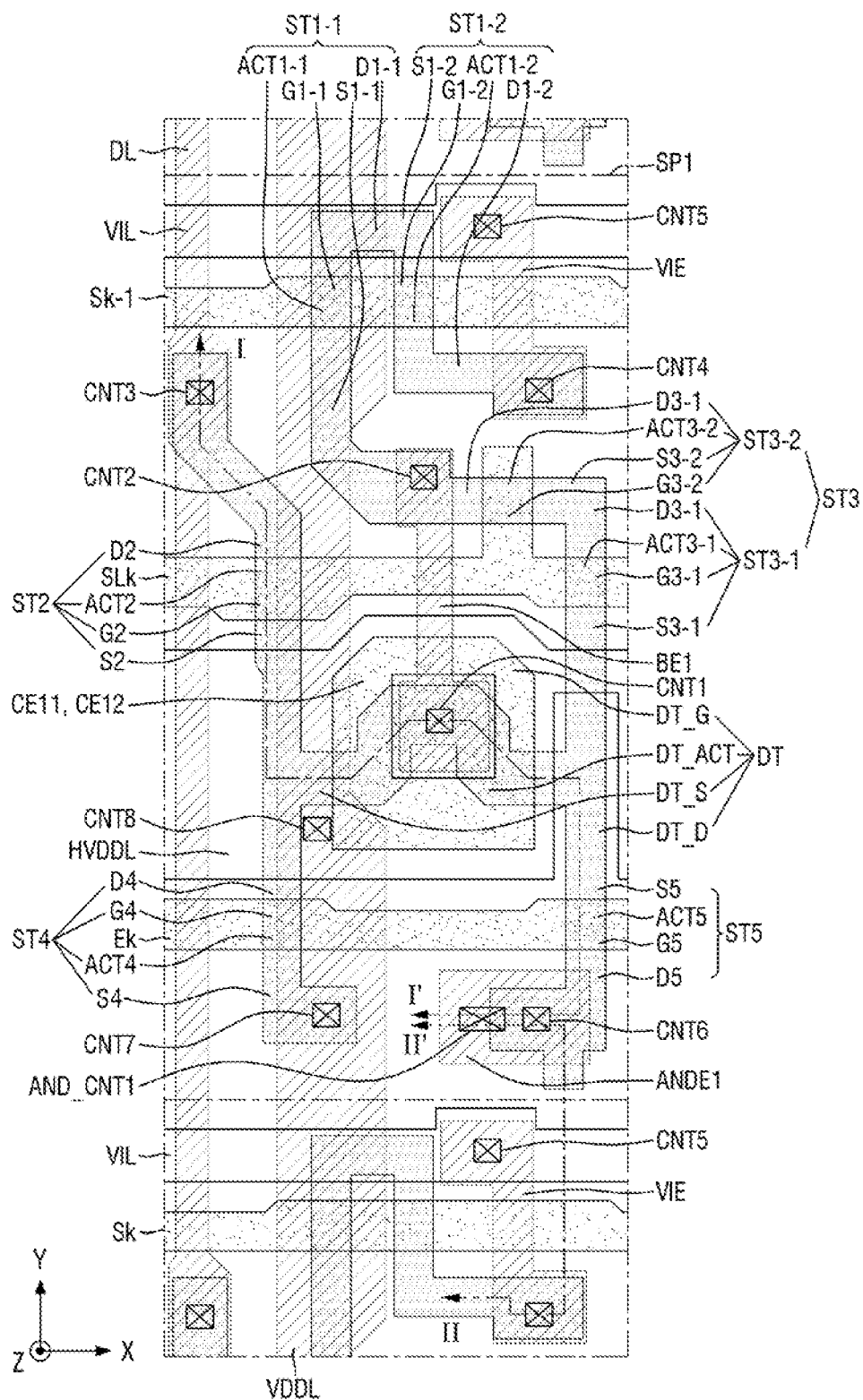
FIG. 9 is a plan view illustrating the first subpixel of FIG. 7.

FIG. 9 is a plan view illustrating the first subpixel of FIG. 7.

Referring to FIG. 9, the first subpixel SP1 may include the driving transistor DT, the first through fifth transistors ST1 through ST5, and the first capacitor C1.

The driving transistor DT may include an active layer DT_ACT, a gate electrode DT_G, a first electrode DT_S, and a second electrode DT_D. The active layer DT_ACT of the driving transistor DT may at least partially overlap with the gate electrode DT_G of the driving transistor DT. The gate electrode DT_G of the driving transistor DT may be connected to a first connecting electrode BE1 through a first contact hole CNT1. The first connecting electrode BE1 may be connected to a first electrode S1-1 of a (1-1)-th transistor ST1-1 and a drain electrode D3-2 of a (3-2)-th transistor ST3-2 through a second contact hole CNT2. The first connecting electrode BE1 may intersect a k-th scan line Sk. The first electrode DT_S of the driving transistor DT may be connected to a first electrode S2 of the second transistor ST2. The second electrode DT_D of the driving transistor DT may be connected to a first electrode S3-1 of a (3-1)-th transistor ST3-1 and a first electrode S5 of the fifth transistor ST5.

The first transistor ST1 may be a dual transistor. The first transistor ST1 may include the (1-1)-th transistor ST1-1 and a (1-2)-th transistor ST1-2.

The (1-1)-th transistor ST1-1 may include an active layer ACT1-1, a gate electrode G1-1, the first electrode S1-1, and a second electrode D1-1. The gate electrode G1-1 of the (1-1)-th transistor ST1-1 may correspond to a portion of a (k−1)-th scan line Sk−1, particularly, a portion of the (k−1)-th scan line Sk−1 that at least partially overlaps with the active layer ACT1-1 of the (1-1)-th transistor ST1-1. The first electrode S1-1 of the (1-1)-th transistor ST1-1 may be connected to the first connecting electrode BE1 of the driving transistor DT through the second contact hole CNT2. The second electrode D1-1 of the (1-1)-th transistor ST1-1 may be connected to a first electrode S1-2 of the (1-2)-th transistor ST1-2.

The (1-2)-th transistor ST1-2 may include an active layer ACT1-2, a gate electrode G1-2, the first electrode S1-2, and a second electrode D1-2. The gate electrode G1-2 of the (1-2)-th transistor ST1-2 may correspond to a portion of the (k−1)-th scan line Sk−1, particularly, a portion of the (k−1)-th scan line Sk−1 that at least partially overlaps with the active layer ACT1-2 of the (1-2)-th transistor ST1-2. The first electrode S1-2 of the (1-2)-th transistor ST1-2 may be connected to the second electrode D1-1 of the (1-1)-th transistor ST1-1. The second electrode D1-2 of the (1-2)-th transistor ST1-2 may be connected to an initialization connecting electrode VIE through a fourth contact hole CNT4.

The second transistor ST2 may include an active layer ACT2, a gate electrode G2, a first electrode S2, and a second electrode D2. The gate electrode G2 of the second transistor ST2 may correspond to a portion of the k-th scan line Sk, particularly, a portion of the k-th scan line Sk that at least partially overlaps with the active layer ACT2 of the second transistor ST2. The first electrode S2 of the second transistor ST2 may be connected to the first electrode DT_S of the driving transistor DT. The second electrode D2 of the second transistor ST2 may be connected to the j-th data line $D_j$ through a third contact hole CNT3.

The third transistor ST3 may be a dual transistor. The third transistor ST3 may include the (3-1)-th transistor ST3-1 and a (3-2)-th transistor ST3-2.

The (3-1)-th transistor ST3-1 may include an active layer ACT3-1, a gate electrode G3-1, the first electrode S3-1, and a second electrode D3-1. The gate electrode G3-1 of the (3-1)-th transistor ST1-1 may correspond to a portion of the k-th scan line Sk, particularly, a portion of the -th scan line Sk that at least partially overlaps with the active layer ACT3-1 of the (3-1)-th transistor ST3-1. The first electrode S3-1 of the (3-1)-th transistor ST3-1 may be connected to the second electrode DT_D of the driving transistor DT. The second electrode D3-1 of the (3-1)-th transistor ST3-1 may be connected to a first electrode S3-2 of the (3-2)-th transistor ST3-2.

The (3-2)-th transistor ST3-2 may include an active layer ACT3-2, a gate electrode G3-2, the first electrode S3-2, and a second electrode D3-2. The gate electrode G3-2 of the (3-2)-th transistor ST3-2 may correspond to a portion of the k-th scan line Sk, particularly, a portion of the k-th scan line Sk that at least partially overlaps with the active layer ACT3-2 of the (3-2)-th transistor ST3-2. The first electrode S3-2 of the (3-2)-th transistor ST3-2 may be connected to the second electrode D3-1 of the (3-1)-th transistor ST3-1. The second electrode D3-2 of the (3-2)-th transistor ST3-2 may be connected to the first connecting electrode BE1 through the second contact hole CNT2.

The fourth transistor ST4 may include an active layer ACT4, a gate electrode G4, a first electrode S4, and a second electrode D4. The gate electrode G4 of the fourth transistor ST4 may correspond to a portion of a k-th emission line Ek, particularly, a portion of the k-th emission line Ek that at least partially overlaps with the active layer ACT4 of the fourth transistor ST4. The first electrode S4 of the fourth transistor ST4 may be connected to a second electrode CE12 of the first capacitor C1 through a seventh contact hole CNT7. The second electrode D4 of the fourth transistor ST4 may be connected to the first electrode DT_S of the driving transistor DT.

The fifth transistor ST5 may include an active layer ACT5, a gate electrode G5, a first electrode S5, and a second electrode D5. The gate electrode G5 of the fifth transistor ST5 may correspond to a portion of the k-th emission line Ek, particularly, a portion of the k-th emission line Ek that at least partially overlaps with the active layer ACT5 of the fifth transistor ST5. The first electrode S5 of the fifth transistor ST5 may be connected to the second electrode DT_D of the driving transistor DT. The second electrode D5 of the fifth transistor ST5 may be connected to an anode electrode AND of the light-emitting element EL through a sixth contact hole CNT6.

A first electrode CE11 of the first capacitor C1 may be a portion of the gate electrode DT_G of the driving transistor DT. The second electrode CE12 of the first capacitor C1 may be a portion of a horizontal driving voltage line HVDDL which is connected to a first driving voltage line VDDL through an eighth contact hole CNT8. The first and second electrodes CE11 and CE12 may at least partially overlap with each other.

Figure 10:
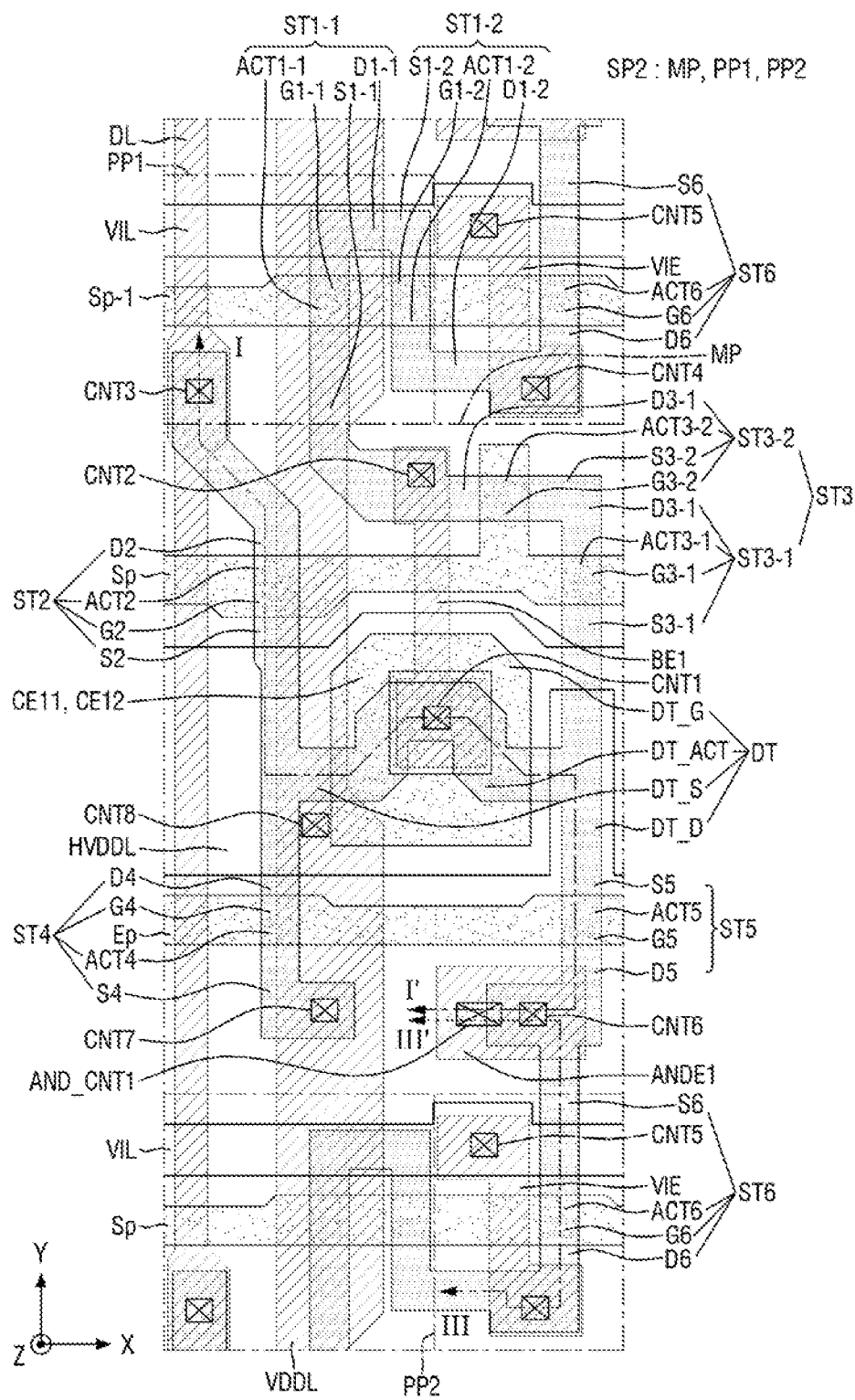
FIG. 10 is a plan view illustrating the second subpixel of FIG. 8.

FIG. 10 is a plan view illustrating the second subpixel of FIG. 8.

The second subpixel SP2 of FIG. 10 differs from the first subpixel SP1 of FIG. 9 in that it further includes the sixth transistor ST6. The second subpixel SP2 of FIG. 10 will hereinafter be described, focusing mainly on the differences with the first subpixel SP1 of FIG. 9.

Figure 11:
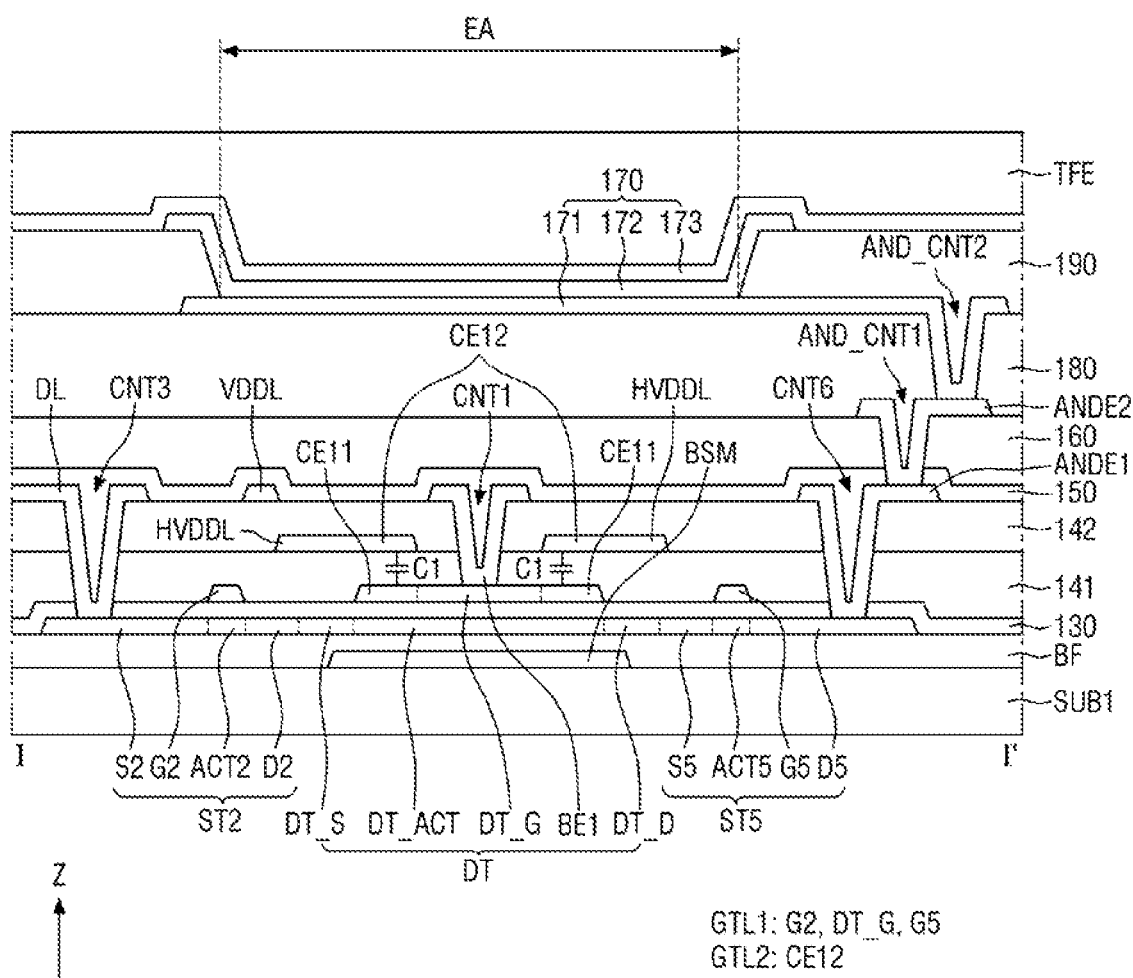
FIG. 11 is a cross-sectional view taken along line I-I' of FIGS. 9 and 10.
Figure 12:
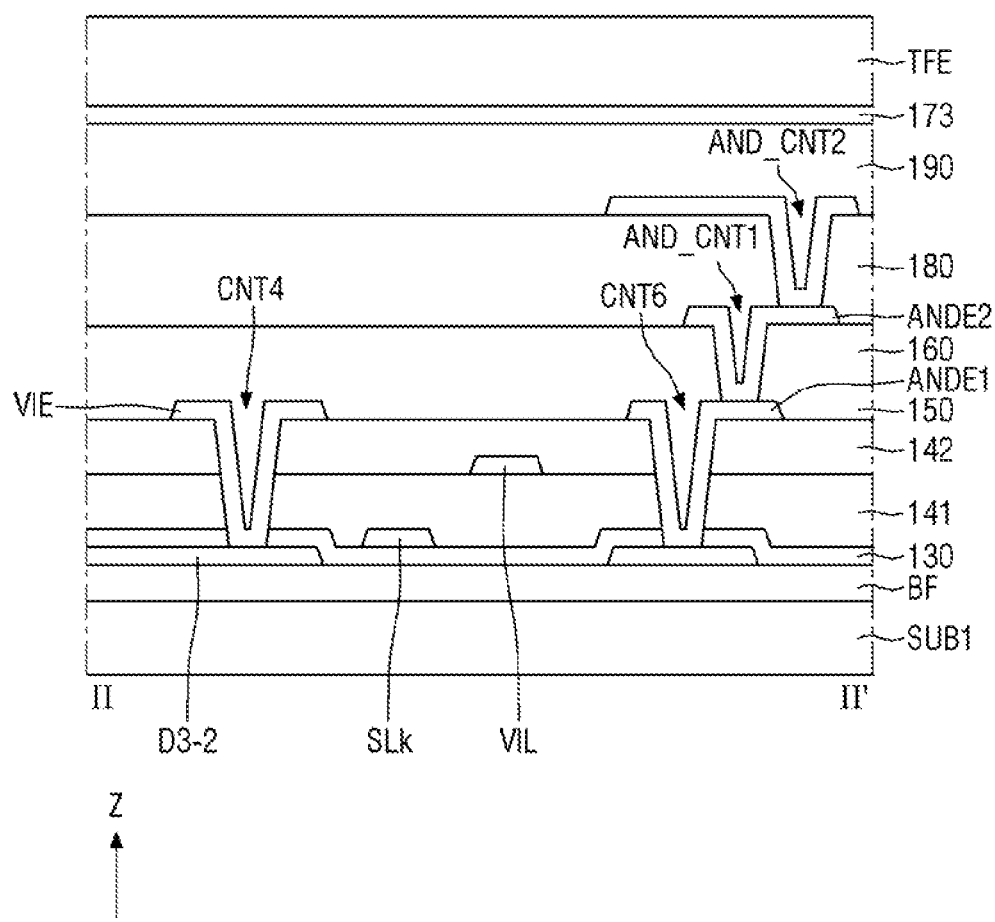
FIG. 12 is a cross-sectional view taken along line II-II' of FIG. 9.

The sixth transistor ST6 may include an active layer ACT6, a gate electrode G6, a first electrode S6, and a second electrode D6. The gate electrode G6 of the sixth transistor ST6, which is a portion of the k-th scan line Sk may correspond to the overlapping area of the active layer ACT6 of the sixth transistor ST6 and the k-th scan line Sk. A first anode connecting electrode ANDE1 may be connected to the first electrode S4 of the sixth transistor ST6 through a sixth contact hole CNT6. A second anode connecting electrode ANDE2 may be connected to the first anode connecting electrode ANDE1 through a first anode contact hole AND_CNT1, as illustrated in FIG. 12. A first electrode 171 of the light-emitting element EL may be connected to the first anode connecting electrode ANDE1 through a second anode contact hole AND_CNT2, as illustrated in FIG. 11. The second electrode D6 of the sixth transistor ST6 may be connected to the initialization connecting electrode VIE through the fourth contact hole CNT4. An initialization voltage line VIL may be connected to the initialization connecting electrode VIE through the fifth contact hole CNT5, and the initialization connecting electrode VIE may be connected to the second electrode D3-2 of the (1-2)-th transistor ST1-2 and the second electrode D4 of the sixth transistor ST6 through the fourth contact hole CNT4. The initialization connecting electrode VIE may be disposed to intersect the k-th scan line Sk.

According to the embodiment of FIGS. 9 and 10, since the sixth transistor ST6 is not provided in the first subpixel SP1, the first subpixel SP1 does not include a second protruding pixel portion PP2 of the second subpixel SP2. For example, due to the absence of the sixth transistor ST6, the second protruding pixel portion PP2 might not be provided in the first subpixel SP1. Thus, when the first subpixel SP1 with no second protruding pixel portion is provided in the sensor area SDA, the wiring area LA can be disposed in a portion of the first subpixel SP1 from which the second protruding pixel portion PP2 is omitted, and as a result, the size of the light-transmitting area TA can be widened as compared to when the second subpixel SP2 with the second protruding pixel portion PP2 is applied to the sensor area SDA.

Figure 13:
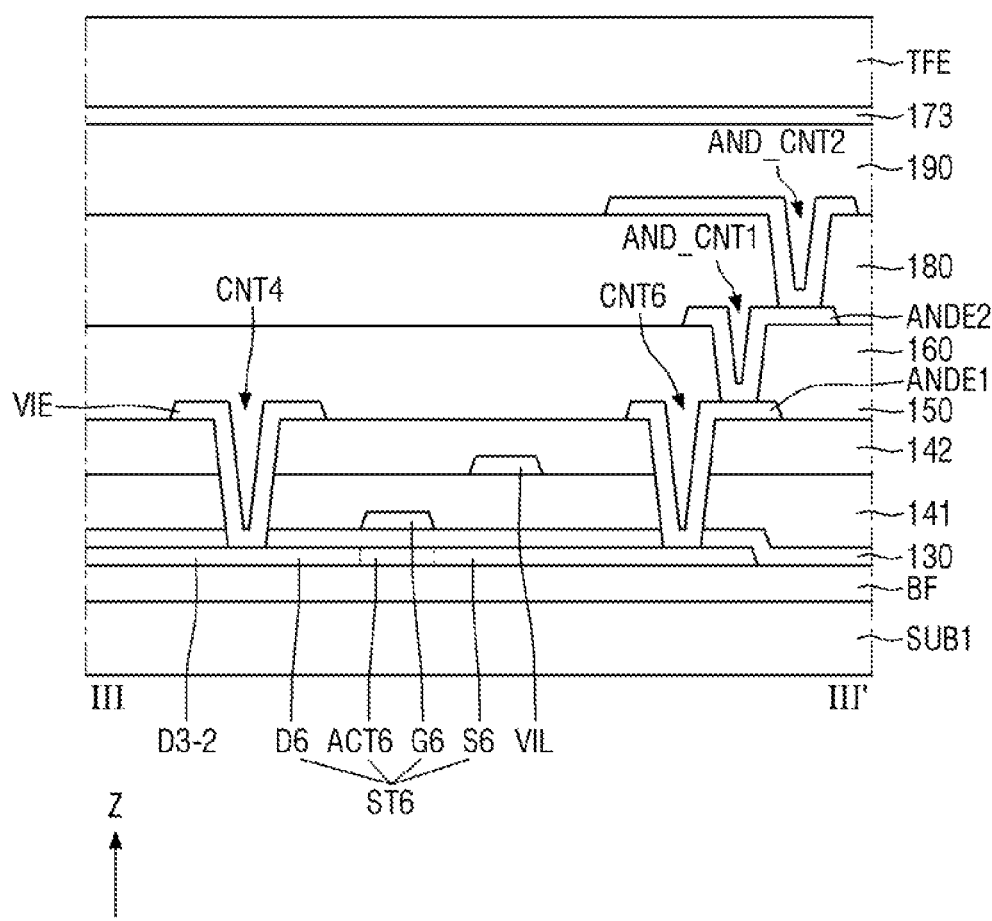
FIG. 13 is a cross-sectional view taken along line III-III' of FIG. 10.

FIG. 11 is a cross-sectional view taken along line I-I' of FIGS. 9 and 10. FIG. 12 is a cross-sectional view taken along line II-II' of FIG. 9. FIG. 13 is a cross-sectional view taken along line III-III' of FIG. 9.

Referring to FIGS. 11 through 13, a TFT layer TFTL, a light-emitting element layer EML, and an encapsulation layer TFE may be sequentially formed on a first substrate SUB1.

The TFT layer TFTL includes a light-shielding layer BML, a buffer film BF, an active layer ACT, a first gate layer GTL1, a second gate layer GTL2, a first source metal layer DTL1, a second source metal layer DTL2, a gate insulating film 130, a first interlayer insulating film 141, a second interlayer insulating film 142, a passivation film 150, a first planarization film 160, and a second planarization film 180.

The light-shielding layer BML may be formed on one surface of the first substrate SUB1. The light-shielding layer BML may be disposed to at least partially overlap with the active layer DT_ACT of the driving transistor DT to prevent the generation of a leakage current in a case where light is incident upon the active layer DT_ACT of the driving transistor DT. FIGS. 11 through 13 illustrate that the light-shielding member BML overlaps with only the active layer DT_ACT of the driving transistor DT, but the present disclosure is not limited thereto. For example, the light-shielding layer BML may at least partially overlap the active layer DT_ACT of the driving transistor DT, and also may at least partially overlap the active layers ACT1 through ACT6 of the first through sixth transistors ST1 through ST6. The light-shielding layer BML may be a single- or multilayer film including molybdenum (Mo), aluminum (Al), chromium (Cr), gold (Au), titanium (Ti), Ni, neodymium (Nd), Cu, or an alloy thereof.

The buffer film BF may be formed on the light-shielding layer BML. The buffer film may be formed on the first substrate SUB1 to protect the TFTs 120 and organic light-emitting layers 172 of the light-emitting element layer EML against moisture that may penetrate the TFTs 120 and the organic light-emitting layers 172 through the first substrate SUB1. The buffer film BF may include a plurality of inorganic films that are alternately stacked. For example, the buffer film BF may be a multilayer film in which at least one of a silicon nitride layer, a silicon oxynitride layer, a silicon oxide layer, a titanium oxide layer, and an aluminum oxide layer is alternately stacked. The buffer film BF may be omitted.

The active layers ACT may be formed on the first substrate SUB1 or on the buffer film BF. The active layer ACT may include polycrystalline silicon, monocrystalline silicon, low-temperature polycrystalline silicon, amorphous silicon, and/or an oxide semiconductor. In a case where the active layer ACT is formed of polycrystalline silicon, the active layer ACT may be electrically conductive. Accordingly, the active layer ACT may include the active layer DT_ACT of the driving transistor DT and the active layers ACT1, ACT2, ACT3, ACT4, ACT5, and ACT6 of the first through sixth transistors ST1 through ST6, and may also include the source and drain electrodes DT_S and DT_D of the driving transistor DT and the source electrodes S1, S2-1, S2-2, S3-1, S3-2, S4, S5, and S6 and the drain electrodes D1, D2-1, D2-2, D3-1, D3-2, D4, D5, and D6 of the first through sixth transistors ST1 through ST6.

The gate insulating film 130 may be formed on the active layer ACT. The gate insulating film 130 may be an inorganic film, for example, a silicon nitride layer, a silicon oxynitride layer, a silicon oxide layer, a titanium oxide layer, and/or an aluminum oxide layer.

The first gate layer GTL1 may be formed on the gate insulating film 130. The first gate layer GTL1 may include not only the gate electrode DT_G of the driving transistor DT and the gate electrodes G1 through G6 of the first through sixth transistors ST1 through ST6, but also the scan lines SL and the emission lines ECL. The first gate layer GTL1 may be a single- or multilayer film including Mo, Al, Cr, Au, Ti, Ni, Nd, Cu, or an alloy thereof.

The first interlayer insulating film 141 may be formed on the first gate layer GTL1. The first interlayer insulating film 141 may be an inorganic film such as, for example, a silicon nitride layer, a silicon oxynitride layer, a silicon oxide layer, a titanium oxide layer, or an aluminum oxide layer. The first interlayer insulating film 141 may include a plurality of inorganic films.

The second gate layer GTL2 may be formed on the first interlayer insulating film 141. The second gate layer GTL2 may include the initialization voltage line VIL and the second electrode CE2 of the first capacitor C1. The second gate layer GTL2 may be a single- or multilayer film including Mo, Al, Cr, Au, Ti, Ni, Nd, Cu, or an alloy thereof.

The second interlayer insulating film 142 may be formed on the second gate layer GTL2. The second interlayer insulating film 142 may be an inorganic film such as, for example, a silicon nitride layer, a silicon oxynitride layer, a silicon oxide layer, a titanium oxide layer, or an aluminum oxide layer. The second interlayer insulating film 142 may include a plurality of inorganic films.

The first source metal layer DTL1 may be formed on the second interlayer insulating film 142. The first source metal layer DTL1 may include the data line DL, the first driving voltage line VDDL, the first connecting electrode BE1, the first anode connecting electrode ANDE1, and the initialization connecting electrode VIE. The first source metal layer DTL1 may be a single- or multilayer film including Mo, Al, Cr, Au, Ti, Ni, Nd, Cu, or an alloy thereof.

The first planarization film 160 may be formed on the first source metal layer DTL1 to planarize height differences formed by the active layer ACT, the first gate layer GTL1, the second gate layer GTL2, and the first source metal layer DTL1. The first planarization film 160 may be an organic film including an acrylic resin, an epoxy resin, a phenolic resin, a polyamide resin, and/or a polyimide resin.

The passivation film 150 may be additionally formed between the first source metal layer DTL1 and the first planarization film 160. The passivation film 150 may be an inorganic film such as, for example, a silicon nitride layer, a silicon oxynitride layer, a silicon oxide layer, a titanium oxide layer, and/or an aluminum oxide layer.

The second source metal layer DTL2 may be formed on the first planarization film 160. The second source metal layer DTL2 may include the second anode connecting electrode ANDE2. The second source metal layer DTL2 may be a single- or multilayer film including Mo, Al, Cr, Au, Ti, Ni, Nd, Cu, or an alloy thereof.

The second planarization film 180 may be formed on the second source metal layer DTL2. The second planarization film 180 may be an organic film including an acrylic resin, an epoxy resin, a phenolic resin, a polyamide resin, and/or a polyimide resin.

The driving transistor DT and the first through sixth transistors ST1 through ST6 may be top-gate transistors in which gate electrodes are disposed above active layers, but the present disclosure is not limited thereto. Alternatively, the driving transistor DT and the first through sixth transistors ST1 through ST6 may be bottom-gate transistors in which gate electrodes are disposed below active layers or double-gate transistors in which gate electrodes are disposed above and below active layers.

The first contact hole CNT1 may be a hole which penetrates the first and second interlayer insulating films 141 and 142 and exposes the gate electrode DT_G of the driving transistor DT. The first connecting electrode BE1 may be connected to the gate electrode DT_G of the driving transistor DT through the first contact hole CNT1.

The second contact hole CNT2 may be a hole which exposes the first electrode S1-1 of the (1-1)-th transistor ST1-1 and the second electrode D3-1 of the (3-1)-th transistor ST3-1 through the gate insulating film 130 and the first and second interlayer insulating films 141 and 142. The second connecting electrode BE2 may be connected to the first S1-1 of the (1-1)-th transistor ST1-1 and the second electrode D3_1 of the (3-1)-th transistor ST3-1 through the second contact hole CNT2.

The third contact hole CNT3 may be a hole which exposes the first electrode S2 of the second transistor ST2 through the gate insulating film 130 and the first and second interlayer insulating films 141 and 142. The j-th data line $D_j$ may be connected to the first electrode S2 of the second transistor ST2 through the third contact hole CNT3.

The fourth contact hole CNT4 may be a hole which exposes the second electrode D1 of the first transistor ST1 and the second electrode D4 of the fourth transistor ST4 through the gate insulating film 130 and the first and second interlayer insulating films 141 and 142. The initialization connecting electrode VIE may be connected to the (1-2)-th electrode of the (1-2)-th transistor ST1-2 and the second electrode D4 of the fourth transistor ST4 through the fourth contact hole CNT4.

The fifth contact hole CNT5 may be a hole which exposes the initialization voltage line VIL through the second interlayer insulating film 142. The initialization connecting electrode VIE may be connected to the initialization voltage line VIL through the fifth contact hole CNT5.

The sixth contact hole CNT6 may be a hole which exposes the second electrode D5 of the fifth transistor ST5 through the gate insulating film 130 and the first and second interlayer insulating films 141 and 142. The first anode connecting electrode ANDE1 may be connected to the sixth transistor ST6 through the sixth contact hole CNT6.

The seventh contact hole CNT7 may be a hole which exposes the first electrode S4 of the fourth transistor ST4 through the gate insulating film 130 and the first and second interlayer insulating films 141 and 142. The first driving voltage line VDDL may be connected to the first electrode S4 of the fourth transistor ST4 through the seventh contact hole CNT7.

The eighth contact hole CNT8 may be a hole which exposes the horizontal driving voltage line HVDDL through the second interlayer insulating film 142. The first driving voltage line VDDL may be connected to the horizontal driving voltage line HVDDL through the eighth contact hole CNT8.

The first anode contact hole AND_CNT1 may be a hole which exposes the first anode connecting electrode ANDE1 through the passivation film 150 and the first planarization film 160.

The second anode contact hole AND_CNT2 may be a hole which exposes the second anode connecting electrode ANDE2 through the second planarization film 180.

The light-emitting element layer EML is formed on the TFT layer TFTL. The light-emitting element layer EML includes light-emitting elements 170 and a pixel-defining film 190.

The light-emitting elements 170 and the pixel-defining film 190 may be formed on the first planarization film 160. Each of the light-emitting elements 170 may include a first electrode 171, an organic light-emitting layer 172, and a second electrode 173.

The first electrode 171 may be formed on the second planarization film 180. The first electrode 171 may be connected to the second anode connecting electrode ANDE2 through the second anode contact hole AND_CNT2, which penetrates the second planarization film 180.

In a top-emission structure that emits light in a direction from the organic light-emitting layer 172 to the second electrode 173, the first electrode 171 may be formed of a metallic material with high reflectance such as a stack of Al and Ti (e.g., Ti/Al/Ti), a stack of Al and indium tin oxide (ITO) (e.g., ITO/Al/ITO), a silver-palladium-copper (APC) alloy, and/or a stack of an APC alloy and ITO (e.g., ITO/APC/ITO).

The pixel-defining film 190 may define the first electrode 171 over the second planarization film 180 and thus to define an emission area EA. The pixel-defining film 190 may cover edges of the first electrode 171. The pixel-defining film 190 may be an organic film including an acrylic resin, an epoxy resin, a phenolic resin, a polyamide resin, or a polyimide resin.

The emission area EA refers to an area where the first electrode 171, the organic light-emitting layer 172, and the second electrode 173 are sequentially stacked so that holes from the first electrode 171 and electrons from the second electrode 173 are combined together in the organic light-emitting layer 172 so as to emit light.

The organic light-emitting layer 172 is formed on the first electrode 171 and on the pixel-defining film 190. The organic light-emitting layer 172 may include an organic material and may emit light of a predetermined color. For example, the organic light-emitting layer 172 may include a hole transport layer, an organic material layer, and an electron transport layer.

The second electrode 173 may be formed on the organic light-emitting layer 172. The second electrode 173 may cover the organic light-emitting layer 172. The second electrode 173 may be a common layer formed in common for all the subpixels. A capping layer may be formed on the second electrode 173.

In the top-emission structure, the second electrode 173 may be formed of a transparent conductive oxide (TCO) material such as ITO or IZO or a translucent metallic material such as magnesium (Mg), Ag, or an alloy of Mg and Ag. In a case where the second electrode 173 is formed of a translucent metallic material, the emission efficiency of the light-emitting element layer EML can be increased due to a micro-cavity effect.

The encapsulation layer TFE may be formed on the light-emitting element layer EML. The encapsulation layer TFE may include at least one inorganic film for preventing the penetration of oxygen or moisture into the light-emitting element layer EML. Also, the encapsulation layer TFE may include at least one organic film for protecting the light-emitting element layer EML from a foreign material such as dust.

A second substrate, instead of the encapsulation layer TFE, may be disposed on the light-emitting element layer EML. The space between the light-emitting element layer EML and the second substrate may be evacuated, or a filling film may be disposed in the space between the light-emitting element layer EML and the second substrate. The filling film may be an epoxy filling film or a silicone filling film.

Figure 14:
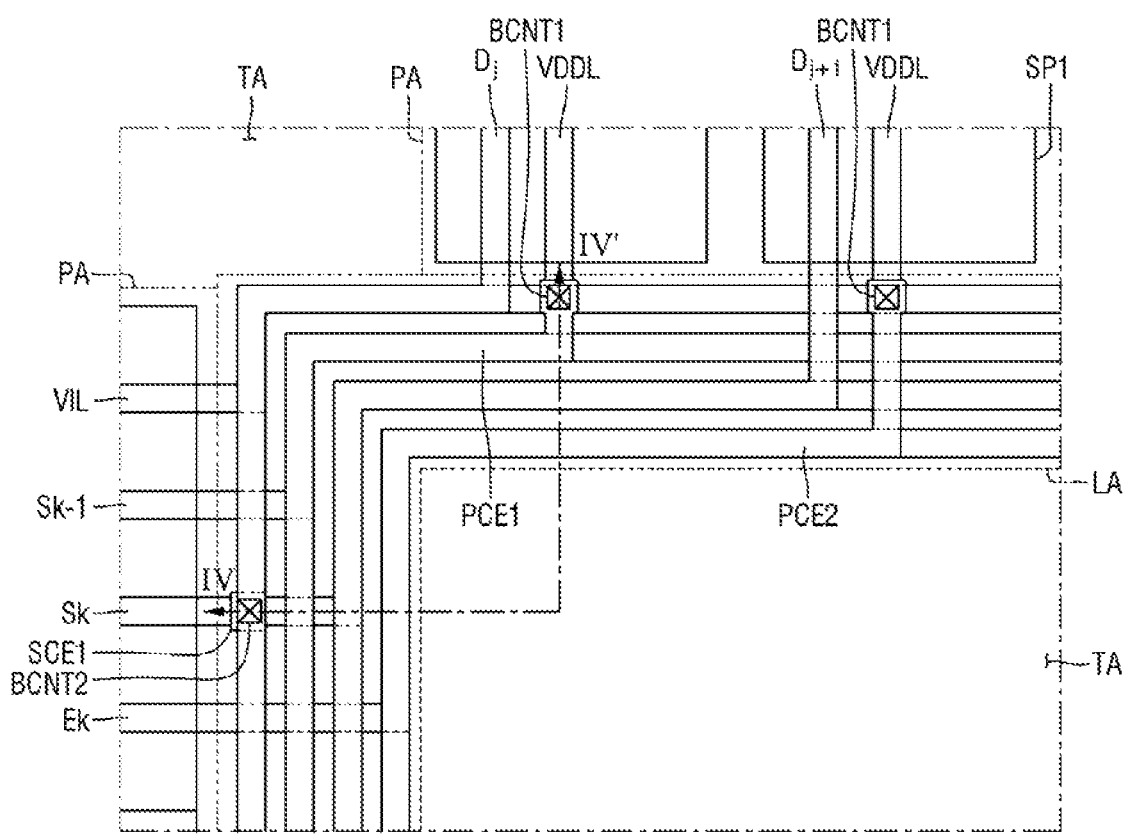
FIG. 14 is a plan view illustrating an area A of FIG. 5.
Figure 15:
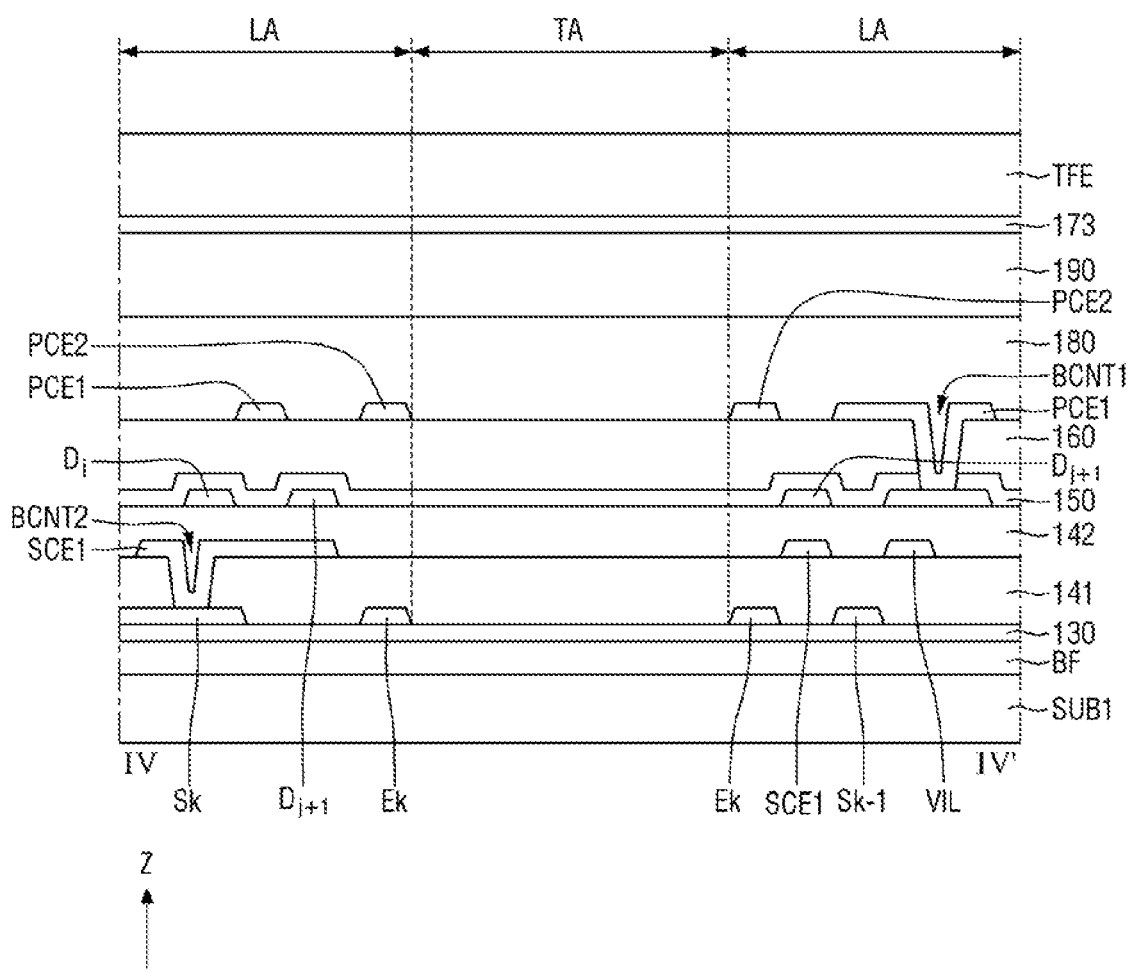
FIG. 15 is a cross-sectional view taken along line IV-IV' of FIG. 14.

FIG. 14 is a plan view illustrating an area A of FIG. 5. FIG. 15 is a cross-sectional view taken along line IV-IV' of FIG. 14.

Referring to FIGS. 14 and 15, in the wiring area LA, the k-th scan line Sk may be connected to a first scan connecting line SCE1 via a second connecting contact hole BCNT2. In the wiring area LA, the first driving voltage lines VDDL may be connected to first and second power supply connecting lines PCE1 and PCE2 via first connecting contact holes BCNT1. For example, one of the first driving voltage lines VDDL may be connected to the first power supply connecting line PCE1 through a first connecting contact hole BCNT1, and another one of the first driving voltage lines VDDL may be connected to the second power supply connecting line PCE2 through another first connecting contact hole BCNT1.

Wiring may be entirely omitted from the light-transmitting area TA so as to increase light transmittance in the light-transmitting area TA. For example, as illustrated in FIG. 15, transparent materials such as the buffer film BF, the gate insulating film 130, the first and second interlayer insulating films 141 and 142, the passivation film 150, the first and second planarization films 160 and 180, the pixel-defining film 190, the second electrode 173, and the encapsulation layer TFE may be disposed in the light-transmitting area TA. Also, the buffer film BF, the gate insulating film 130, the first and second interlayer insulating films 141 and 142, the passivation film 150, the first and second planarization films 160 and 180, the pixel-defining film 190, and the encapsulation layer TFE may be entirely or partially removed to increase light transmittance in the light-transmitting area TA. Also, the second electrode 173 may be removed to increase light transmittance in the light-transmitting area TA.

In the wiring area LA, the j-th data line $D_j$ may at least partially overlap with the initialization voltage line VIL, the (k−1)- and k-th scan lines Sk−1 and Sk, and the k-th emission line Ek. The overlapping area of the j-th data line $D_j$ and the initialization voltage line VIL may be greater than the overlapping area of the j-th data line $D_j$ and the (k−1)-th scan line Sk−1, the overlapping area of the j-th data line $D_j$ and the k-th scan line Sk, and the overlapping area of the j-th data line $D_j$ and the k-th emission line Ek.

In the wiring area LA, the first power supply connecting line PCE1 may at least partially overlap with the initialization voltage line VIL, the (k−1)- and k-th scan lines Sk−1 and Sk, and the emission line Ek. The overlapping area of the first power supply connecting line PCE1 and the (k−1)-th scan line Sk−1 may be greater than the overlapping area of the first power supply connecting line PCE1 and the initialization voltage line VIL, the overlapping area of the first power supply connecting line PCE1 and the k-th scan line Sk, and the overlapping area of the first power supply connecting line PCE1 and the k-th emission line Ek.

In the wiring area LA, the (j+1)-th data line $D_{j+1}$ may at least partially overlap with the initialization voltage line VIL, the (k−1)- and k-th scan lines Sk−1 and Sk, and the k-th emission line Ek. The overlapping area of the (j+1)-th data line $D_{j+1}$ and the k-th scan line Sk may be greater than the overlapping area of the (j+1)-th data line $D_{j+1}$ and the initialization voltage line VIL, the overlapping area of the (j+1)-th data line $D_{j+1}$ and the (k−1)-th scan line Sk−1, and the overlapping area of the (j+1)-th data line $D_{j+1}$ and the k-th emission line Ek.

In the wiring area LA, the second power supply connecting line PCE2 may at least partially overlap with the initialization voltage line VIL, the (k−1)- and k-th scan lines Sk−1 and Sk, and the emission line Ek. The overlapping area of the second power supply connecting line PCE2 and the k-th emission line Ek may be greater than the overlapping area of the second power supply connecting line PCE2 and the initialization voltage line VIL, the overlapping area of the second power supply connecting line PCE2 and the (k−1)-th scan line Sk−1, and the overlapping area of the second power supply connecting line PCE2 and the k-th scan line Sk.

FIGS. 14 and 15 illustrate that the first connecting contact holes BCNT1 overlap with the initialization voltage line VIL, but the present disclosure is not limited thereto. Alternatively, the first connecting contact holes BCNT1 may at least partially overlap with one of the (k−1)-th scan line Sk−1, the first scan connecting line SCE1, and the k-th emission line Ek. Yet alternatively, one of the first connecting contact holes BCNT1 may at least partially overlap with one of the initialization voltage line VIL, the (k−1)-th scan line Sk−1, the first scan connecting line SCE1, and the k-th emission line Ek, and another one of the first connecting contact holes BCNT1 may at least partially overlap with another one of the initialization voltage line VIL, the (k−1)-th scan line Sk−1, the first scan connecting line SCE1, and the k-th emission line Ek.

In the wiring area LA, the j- and (j+1)-th data lines $D_j$ and $D_{j+1}$ may be formed of the first source metal layer DTL1. In the wiring area LA, the j- and (j+1)-th data lines $D_j$ and $D_{j+1}$ may be disposed on the second interlayer insulating film 142. In the wiring area LA, the first and second power supply connecting lines PCE1 and PCE2 may be formed of the second source metal layer DTL2. In the wiring area LA, the first and second power supply connecting lines PCE1 and PCE2 may be disposed on the first planarization film 160. For example, in the wiring area LA, the j- and (j+1)-th data lines $D_j$ and $D_{j+1}$ may be disposed in a different layer from the first and second power supply connecting lines PCE1 and PCE2.

In a case where in the wiring area LA, the j- and (j+1)-th data lines D and $D_{j+1}$ and the first and second power supply connecting lines PCE1 and PCE2 are disposed in the same layer, the j- and (j+1)-th data lines $D_j$ and $D_{j+1}$ and the first and second power supply connecting lines PCE1 and PCE2 may be short-circuited due to process error if the distance between each pair of adjacent lines among the j- and (j+1)-th data lines $D_j$ and $D_{j+1}$ and the first and second power supply connecting lines PCE1 and PCE2 is smaller than a predetermined minimum distance. Thus, in a case where the j- and (j+1)-th data lines $D_j$ and $D_{j+1}$ and the first and second power supply connecting lines PCE1 and PCE2 are disposed in the same layer, the j- and (j+1)-th data lines $D_j$ and $D_{j+1}$ and the first and second power supply connecting lines PCE1 and PCE2 may be formed at a distance greater than a predefined minimum distance from one another in consideration of process error.

In a case where in the wiring area LA, the j- and (j+1)th data lines $D_j$ and $D_{j+1}$ and the first and second power supply connecting lines PCE1 and PCE2 are disposed in different layers, each pair of adjacent lines among the j- and (j+1)-th data lines $D_j$ and $D_{j+1}$ and the first and second power supply connecting lines PCE1 and PCE2 may be disposed in different layers.

Thus, if the j- and (j+1)-th data lines $D_j$ and $D_{j+1}$ are disposed in a different layer from the first and second power supply connecting lines PCE1 and PCE2, process error need not be considered, and as a result, the distance between each pair of adjacent lines among the j- and (j+1)-th data lines $D_j$ and $D_{j+1}$ and the first and second power supply connecting lines PCE1 and PCE2 may be smaller than the predefined minimum distance.

According to the structure depicted in FIGS. 14 and 15, in a case where in the wiring area LA, the j- and (j+1)-th data lines $D_j$ and $D_{j+1}$ are disposed in a different layer from the first and second power supply connecting lines PCE1 and PCE2, the distances between the j- and (j+1)-th data lines $D_j$ and $D_{j+1}$ and the first and second power supply connecting lines PCE1 and PCE2 may become narrower when the j- and (j+1)-th data lines $D_j$ and $D_{j+1}$ and the first and second power supply connecting lines PCE1 and PCE2 are all disposed in the same layer. As a result, the light-transmitting area TA can be widened.

In the wiring area LA, the (k−1)-th scan line Sk−1 and the k-th emission line Ek may be formed of the first gate metal layer GTL1. In the wiring area LA, the (k−1)-th scan line Sk−1 and the k-th emission line Ek may be disposed on the gate insulating film 130. In the wiring area LA, the initialization voltage line VIL and the first scan connecting line SCE1 may be formed of the second gate metal layer GTL2. In the wiring area LA, the initialization voltage line VIL and the first scan connecting line SCE1 may be disposed on the first interlayer insulating film 141. For example, in the wiring area LA, the initialization voltage line VIL and the first scan connecting line SCE1 may be disposed in a different layer from the (k−1)-th scan line Sk−1 and the k-th emission line Ek.

In a case where in the wiring area LA, the initialization voltage line VIL, the (k−1)-th data line Sk−1, the first scan connecting line SCE1, and the k-th emission line Ek are disposed in the same layer, the initialization voltage line VIL, the (k−1)-th data line Sk−1, the first scan connecting line SCE1, and the k-th emission line Ek may be short-circuited due to process error if the distance between each pair of adjacent lines among the initialization voltage line VIL, the (k−1)-th data line Sk−1, the first scan connecting line SCE1, and the k-th emission line Ek is smaller than a predetermined minimum distance. Thus, in a case where the initialization voltage line VIL, the (k−1)-th data line Sk−1, the first scan connecting line SCE1, and the k-th emission line Ek are disposed in the same layer, the initialization voltage line VIL, the (k−1)-th data line Sk−1, the first scan connecting line SCE1, and the k-th emission line Ek may be formed at a distance greater than the predefined minimum distance from one another in consideration of process error.

In a case where in the wiring area LA, the (k−1)-th data line Sk−1 and the k-th emission line Ek are disposed in a different layer from the (k−1)-th scan line Sk−1 and the first scan connecting line SCE1, each pair of adjacent lines among the initialization voltage line VIL, the (k−1)-th data line Sk−1, the first scan connecting line SCE1, and the k-th emission line Ek may be disposed in different layers. Thus, if the (k−1)-th data line Sk−1 and the k-th emission line Ek are disposed in a different layer from the (k−1)-th scan line Sk−1 and the first scan connecting line SCE1, process error need not be considered, and as a result, the distance between each pair of adjacent lines among the initialization voltage line VIL, the (k−1)-th data line Sk−1, the first scan connecting line SCE1, and the k-th emission line Ek may be smaller than the predefined minimum distance.

According to the structure depicted in FIGS. 14 and 15, in a case where in the wiring area LA, the (k−1)-th data line Sk−1 and the k-th emission line Ek are disposed in a different layer from the (k−1)-th scan line Sk−1 and the first scan connecting line SCE1, the distances between the initialization voltage line VIL, the (k−1)-th data line Sk−1, the first scan connecting line SCE1, and the k-th emission line Ek may become narrower when the initialization voltage line VIL, the (k−1)-th data line Sk−1, the first scan connecting line SCE1, and the k-th emission line Ek are all disposed in the same layer. As a result, the light-transmitting area TA can be widened.

Figure 16:
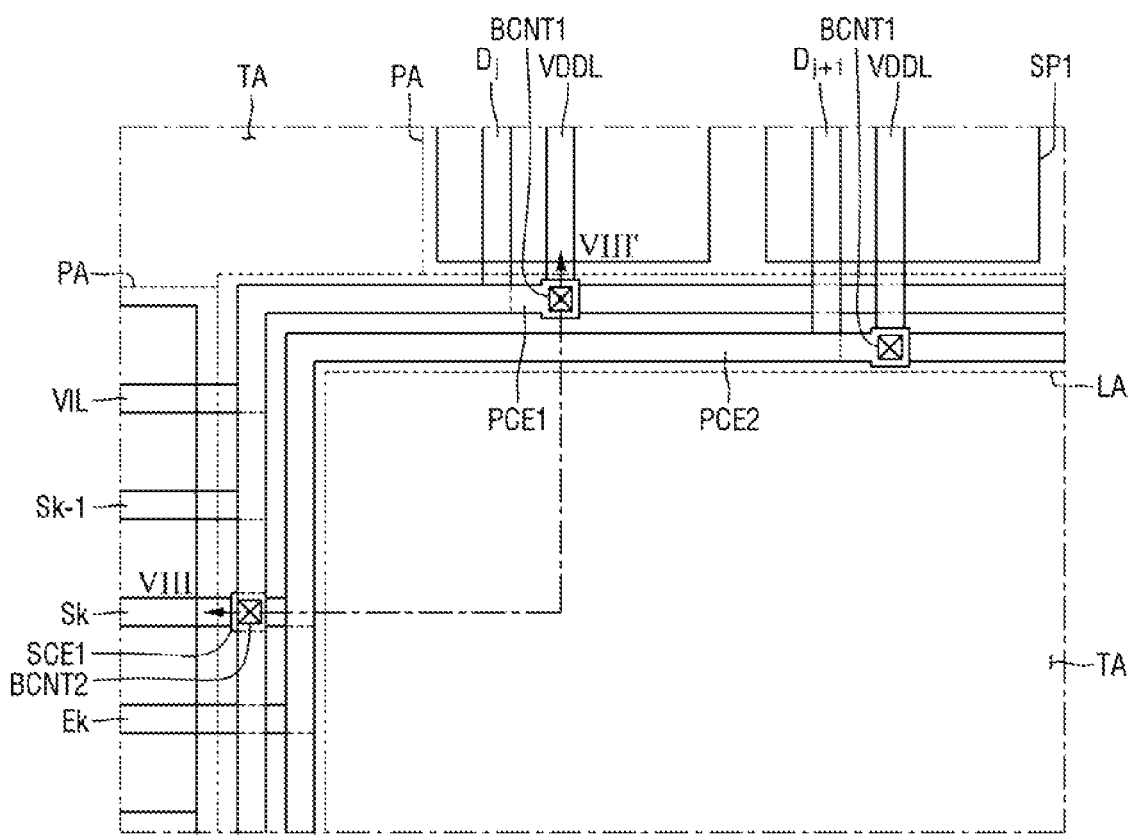
FIG. 16 is a plan view illustrating the area A of FIG. 5.
Figure 17:
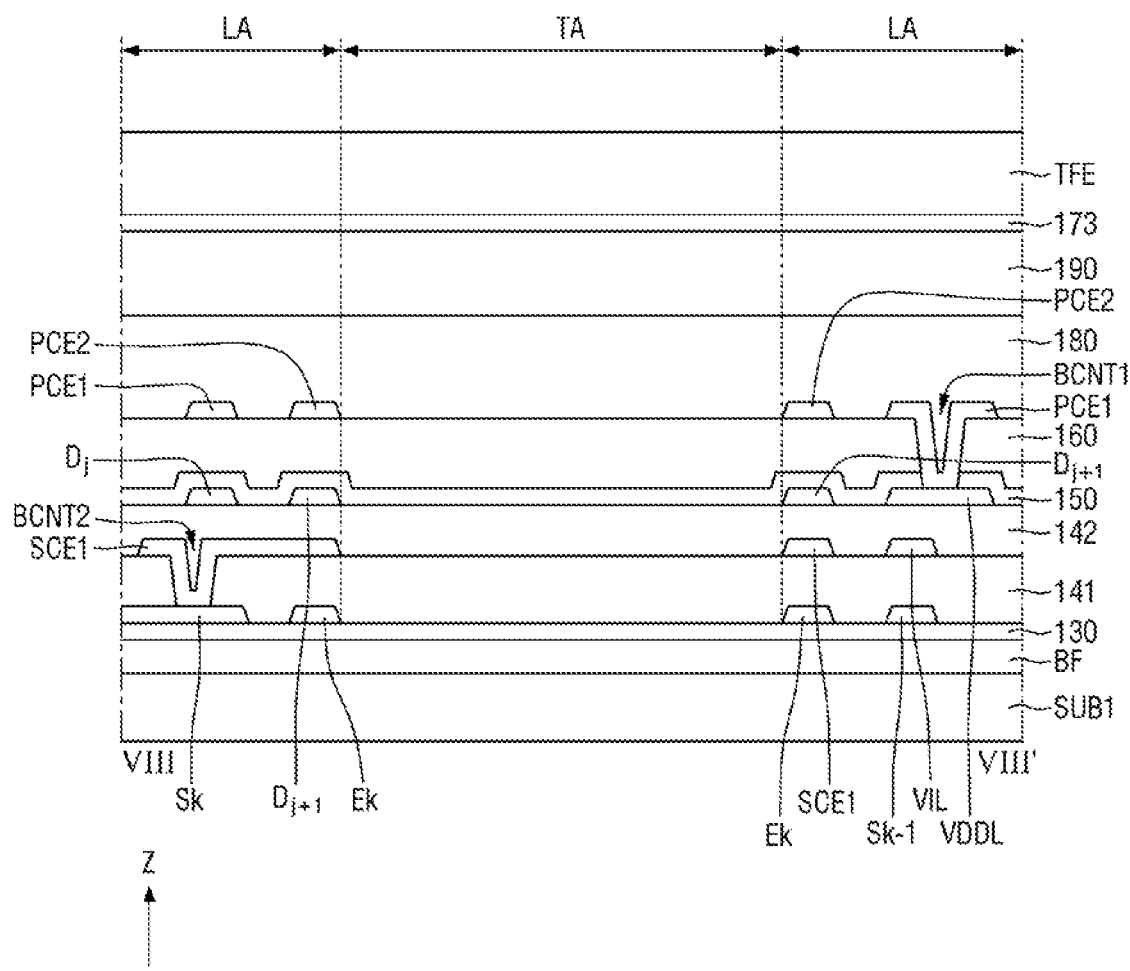
FIG. 17 is a cross-sectional view taken along line VIII-VIII' of FIG. 16.

FIG. 16 is a plan view illustrating the area A of FIG. 5. FIG. 17 is a cross-sectional view taken along line VIII-VIII' of FIG. 16.

The embodiment of FIGS. 16 and 17 differs from the embodiment of FIGS. 14 and 15 in that the initialization voltage line VIL, the (k−1)-th scan line Sk−1, the j-th data line $D_j$, and the first power supply connecting line PCE1 are disposed to at least partially overlap with one another in the thickness direction (e.g. the Z-axis direction), and that the k-th scan line Sk, the k-th emission line Ek, the (j+1)-th data line $D_{j+1}$, and the second power supply connecting line PCE2 are disposed to at least partially overlap with one another in the thickness direction (e.g. the Z-axis direction).

According to the embodiment of FIGS. 16 and 17, since in the wiring area LA, the (k−1)-th scan line Sk−1 and the k-th emission line Ek are disposed in a different layer from an initialization connecting line VE and the first scan connecting line SCE1, the initialization voltage line VIL and the (k−1)-th scan line Sk−1, which are adjacent to each other, may be disposed to at least partially overlap with each other in the thickness direction, and the first scan connecting line SCE1 and the k-th emission line Ek, which are adjacent to each other, may be disposed to at least partially overlap with each other in the thickness direction. Also, since in the wiring area LA, the (j−1)- and j-th data lines $D_{j+1}$ and $D_j$ are disposed in a different layer from the first and second power supply connecting lines PCE1 and PCE2, the j-th data line $D_j$ and the first power supply connecting line PCE1, which are adjacent to each other, may be disposed to at least partially overlap with each other in the thickness direction, and the (j+1)-th data line $D_{j+1}$ and the second power supply connecting line PCE2, which are adjacent to each other, may be disposed to at least partially overlap with each other in the thickness direction. Therefore, the width of the wiring area LA can be further reduced, as compared to the embodiment of FIGS. 14 and 15, and as a result, the light-transmitting are TA can be further widened.

Figure 18:
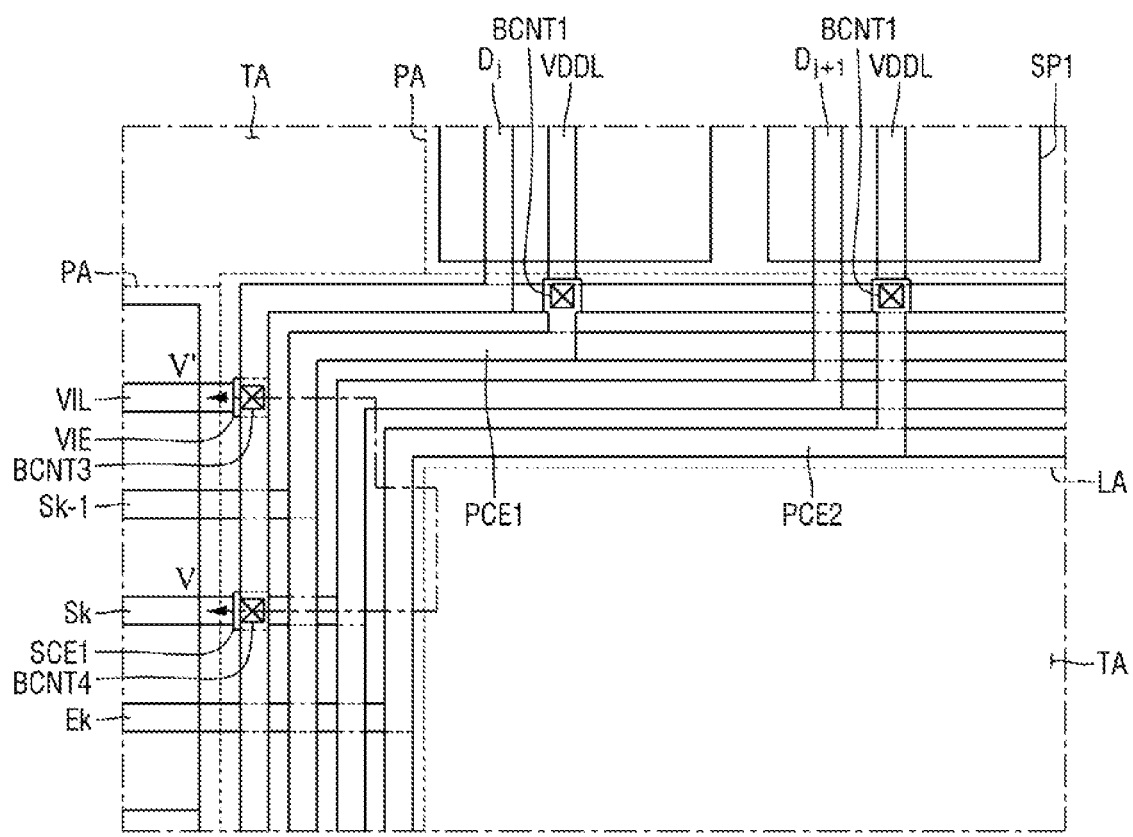
FIG. 18 is a plan view illustrating the area A of FIG. 5.
Figure 18:
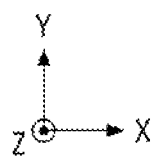
Figure 19:
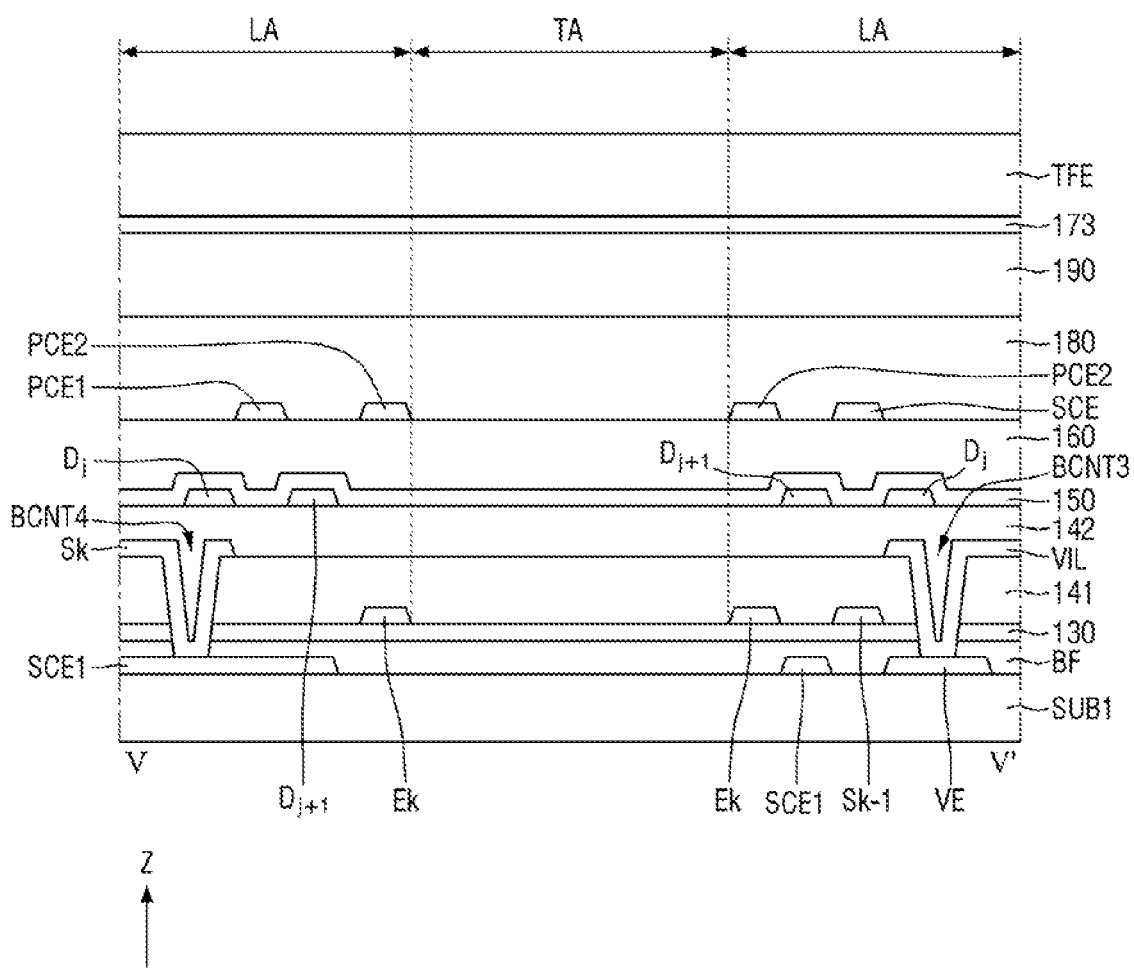
FIG. 19 is a cross-sectional view taken along line V-V' of FIG. 18.

FIG. 18 is a plan view illustrating the area A of FIG. 5. FIG. 19 is a cross-sectional view taken along line V-V' of FIG. 18.

The embodiment of FIGS. 18 and 19 differs from the embodiment of FIGS. 14 and 15 in that the initialization voltage line is connected to the initialization connecting line VE, and that the initialization connecting line VE and the first scan connecting line SCE1 are formed of the light-shielding layer BML. The embodiment of FIGS. 18 and 19 will hereinafter be described, focusing mainly on the differences with the embodiment of FIGS. 14 and 15. To the extent that details concerning various elements have been omitted herein, it may be assumed that these details are at least similar to corresponding elements previously described.

Referring to FIGS. 18 and 19, in the wiring area LA, the initialization voltage line VIL may be connected to the initialization connecting line VE through a third connecting contact hole BCNT3. In the wiring area LA, the k-th scan line Sk may be connected to the first scan connecting line SCE1 through a fourth connecting contact hole BCNT4.

In the wiring area LA, the j-th data line $D_j$, the first power supply connecting line PCE1, the (j+1)-th data line $D_{j+1}$, and the second power supply connecting line PCE2 may at least partially overlap with the initialization connecting line VE, instead of the initialization voltage line VIL.

In the wiring area LA, the initialization connecting line VE and the first scan connecting line SCE1 may be formed of the light-shielding layer BML. In the wiring area LA, the initialization connecting line VE and the first scan connecting line SCE1 may be disposed on the buffer film BF. In the wiring area LA, the (k−1)-th scan line Sk−1 and the k-th emission line Ek may be formed of the first gate metal layer GTL1. In the wiring area LA, the (k−1)-th scan line Sk−1 and the k-th emission line Ek may be disposed on the gate insulating film 130.

The distance between the light-shielding layer BML and the first gate metal layer GTL1 may be greater than the distance between the first and second gate metal layers GTL1 and GTL2. Thus, the influence of the initialization connecting line VE and the first scan connecting line SCE1, which are formed of the light-shielding layer BML, upon the (k−1)-th scan line Sk−1 and the k-th emission line Ek, which are formed of the first gate metal layer GTL1, and vice versa due to coupling can be reduced.

In a case where in the wiring area LA, the (k−1)-th scan line Sk−1 and the k-th emission line Ek are disposed in a different layer from the initialization connecting line VE and the first scan connecting line SCE1, each pair of adjacent lines among the initialization connecting line VE, the (k−1)-th scan line Sk−1, the first scan connecting line SCE1, and the k-th emission line Ek may be disposed in different layers. Thus, if the (k−1)-th scan line Sk−1 and the k-th emission line Ek are disposed in a different layer from the initialization connecting line VE and the first scan connecting line SCE1, process error need not be considered, and as a result, the distance between each pair of adjacent lines among the initialization connecting line VE, the (k−1)-th scan line Sk−1, the first scan connecting line SCE1, and the k-th emission line Ek may be smaller than a predefined minimum distance.

According to the structures depicted in FIGS. 18 and 19, in a case where in the wiring area LA, the (k−1)-th data line Sk−1 and the k-th emission line Ek are disposed in a different layer from the (k−1)-th scan line Sk−1 and the first scan connecting line SCE1, the distances between the initialization connecting line VE, the (k−1)-th scan line Sk−1, the first scan connecting line SCE1, and the k-th emission line Ek may become narrower when the initialization connecting line VE, the (k−1)-th scan line Sk−1, the first scan connecting line SCE1, and the k-th emission line Ek are all disposed in the same layer. As a result, the light-transmitting area TA can be widened.

In the structures depicted in FIGS. 18 and 19, the initialization connecting line VE and the (k−1)-th scan line Sk−1, which are adjacent to each other, may be disposed to at least partially overlap with each other in the thickness direction, and the first scan connecting line SCE1 and the k-th emission line Ek, which are adjacent to each other, may be disposed to at least partially overlap with each other in the thickness direction. Also, the j-th data line $D_j$ and the first power supply connecting line PCE1, which are adjacent to each other, may be disposed to at least partially overlap with each other in the thickness direction, and the (j+1)-th data line $D_{j+1}$ and the second power supply connecting line PCE2, which are adjacent to each other, may be disposed to at least partially overlap with each other in the thickness direction. Therefore, the width of the wiring area LA can be further reduced, and as a result, the light-transmitting are TA can be further widened.

Figure 20:
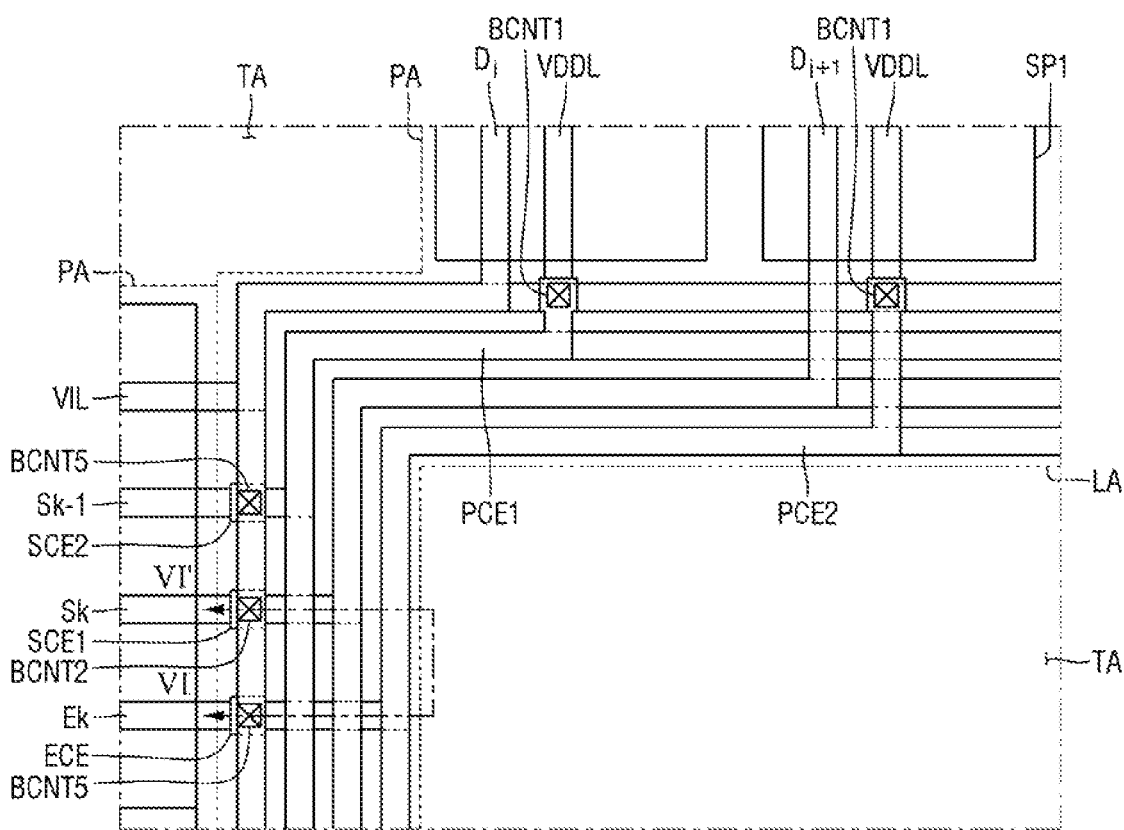
FIG. 20 is a plan view illustrating the area A of FIG. 5.
Figure 21:
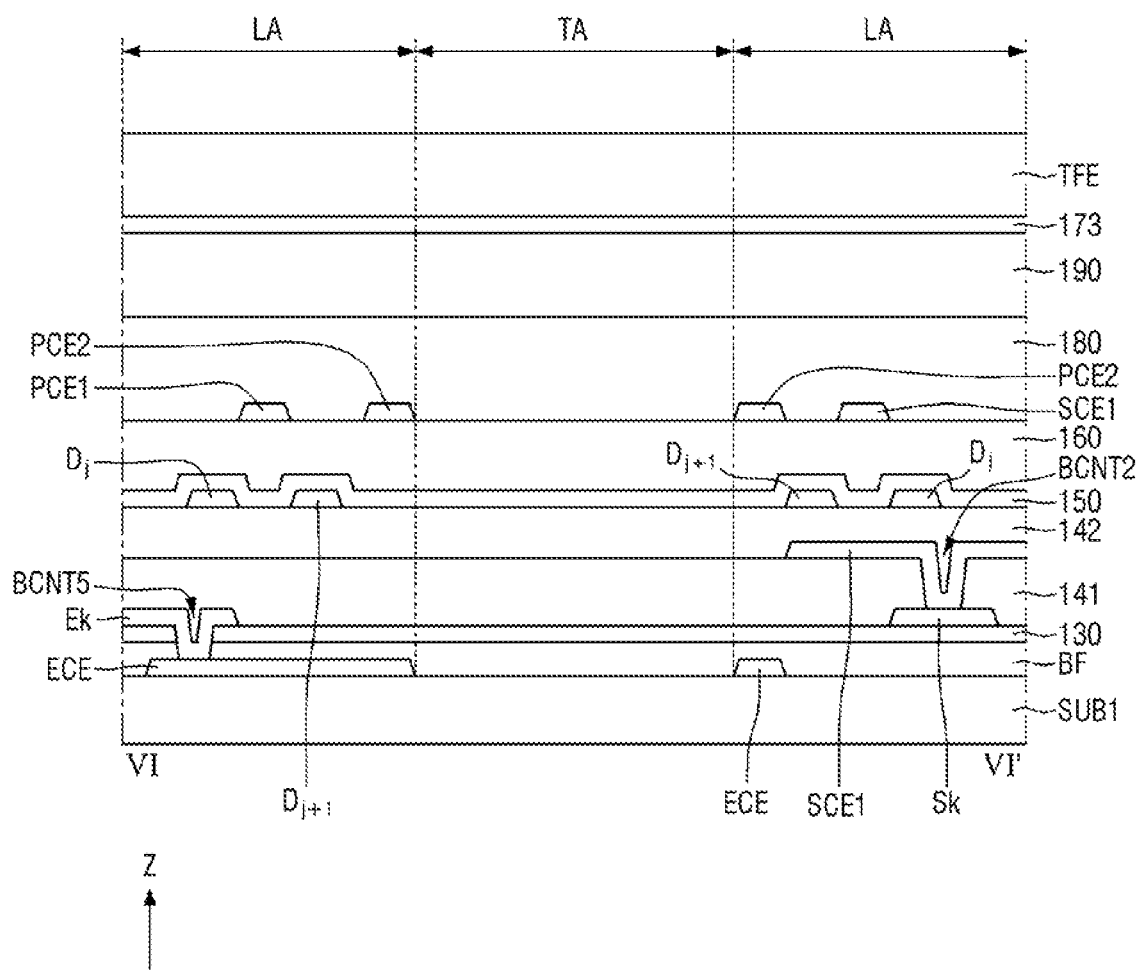
FIG. 21 is a cross-sectional view taken along line VI-VI' of FIG. 20.

FIG. 20 is a plan view illustrating the area A of FIG. 5. FIG. 21 is a cross-sectional view taken along line VI-VI' of FIG. 20.

The embodiment of FIGS. 20 and 21 differs from the embodiment of FIGS. 14 and 15 in that the (k−1)-th scan line Sk−1 is connected to a second scan connecting line SCE2, and that the k-th emission line Ek is connected to an emission connecting line ECE. The embodiment of FIGS. 20 and 21 will hereinafter be described, focusing mainly on the differences with the embodiment of FIGS. 14 and 15. To the extent that details concerning various elements have been omitted herein, it may be assumed that these details are at least similar to corresponding elements previously described.

Referring to FIGS. 20 and 21, in the wiring area LA, the (k−1)-th scan line Sk−1 may be connected to the second scan connecting line SCE2 through a fifth connecting contact hole BCNT5. In the wiring area LA, the k-th emission line Ek may be connected to the emission connecting line ECE through another fifth connecting contact hole BCNT5.

In the wiring area LA, the j-th data line $D_j$, the first power supply connecting line PCE1, the (j+1)-th data line $D_{j+1}$, and the second power supply connecting line PCE2 may at least partially overlap with the second scan connecting line SCE2, instead of the (k−1)-th scan line Sk−1, and may at least partially overlap with the emission connecting line ECE, instead of the k-th emission line Ek.

In the wiring area LA, the second scan connecting line SCe2 and the emission connecting line ECE may be formed of the light-shielding layer BML. In the wiring area LA, the second scan connecting line SCE2 and the emission connecting line ECE may be disposed on the buffer film BF, The initialization voltage line VIL and the first scan connecting line SCE1 may be formed of the second gate metal layer GTL2. In the wiring area LA, the initialization voltage line VIL and the first scan connecting line SCE1 may be disposed on the first interlayer insulating film 141.

The distance between the light-shielding layer BML and the second gate metal layer GTL2 may be greater than the distance between the first and second gate metal layers GTL1 and GTL2. Thus, the influence of the second scan connecting line SCE2 and the emission connecting line ECE, which are formed of the light-shielding layer BML, upon the initialization voltage line VIL and the first scan connecting line SCE1, which are formed of the second gate metal layer GTL2, and vice versa due to coupling can be reduced.

In a case where in the wiring area LA, the second scan connecting line SCE2 and the emission connecting line ECE are disposed in a different layer from the initialization voltage line VIL and the first scan connecting line SCE1, each pair of adjacent lines among the initialization voltage line VIL, the first scan connecting line SCE1, the second scan connecting line SCE2, and the emission connecting line ECE may be disposed in different layers. Thus, if the second scan connecting line SCE2 and the emission connecting line ECE are disposed in a different layer from the initialization voltage line VIL and the first scan connecting line SCE1, process error need not be considered, and as a result, the distance between each pair of adjacent lines among the initialization voltage line VIL, the first scan connecting line SCE1, the second scan connecting line SCE2, and the emission connecting line ECE may be smaller than a predefined minimum distance.

According to the embodiment of FIGS. 20 and 21, in a case where in the wiring area LA, the second scan connecting line SCE2 and the emission connecting line ECE are disposed in a different layer from the initialization voltage line VI L and the first scan connecting line SCE1, the distances between the initialization voltage line VIL, the first scan connecting line SCE1, the second scan connecting line SCE2, and the emission connecting line ECE may become narrower than when the initialization voltage line VIL, the first scan connecting line SCE1, the second scan connecting line SCE2, and the emission connecting line ECE are all disposed in the same layer. As a result, the light-transmitting area TA can be widened.

In the embodiment of FIGS. 20 and 21, the initialization connecting line VE and the second scan connecting line SCE2, which are adjacent to each other, may be disposed to at least partially overlap with each other in the thickness direction, and the first scan connecting line SCE1 and the emission connecting line ECE, which are adjacent to each other, may be disposed to at least partially overlap with each other in the thickness direction. Also, the j-th data line $D_j$ and the first power supply connecting line PCE1, which are adjacent to each other, may be disposed to at least partially overlap with each other in the thickness direction, and the (j+1)-th data line $D_{j+1}$ and the second power supply connecting line PCE2, which are adjacent to each other, may be disposed to at least partially overlap with each other in the thickness direction. Therefore, the width of the wiring area LA can be further reduced, and as a result, the light-transmitting are TA can be further widened.

Figure 22:
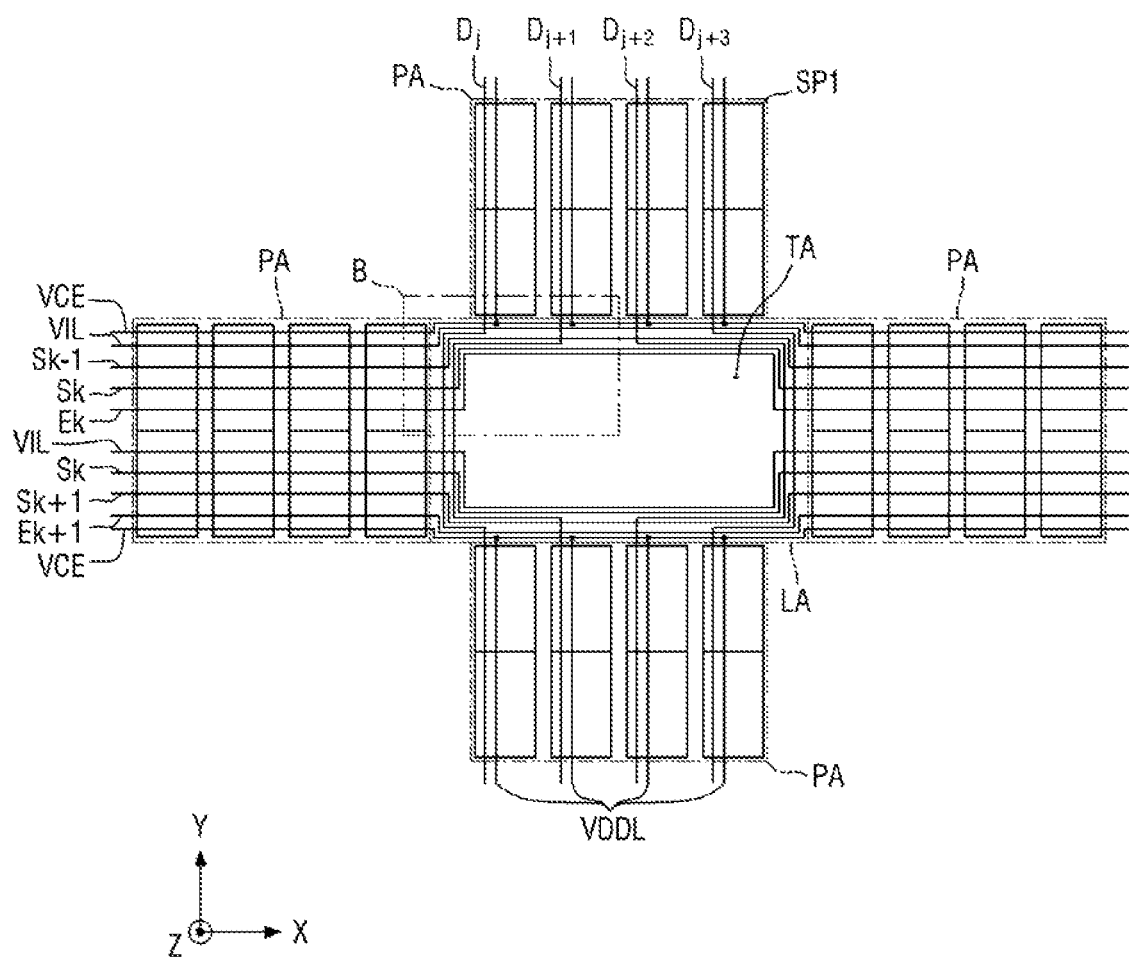
FIG. 22 is a plan view illustrating pixels, the scan lines, the data lines, and the first driving voltage lines in the sensor area of the display device of FIG. 1.

FIG. 22 is a plan view illustrating pixels, the scan lines, the data lines, and the first driving voltage lines in the sensor area of the display device of FIG. 1.

The embodiment of FIG. 22 differs from the embodiment of FIG. 5 in that voltage connecting lines VCE which are connected to the first driving voltage lines VDDL are additionally provided. The embodiment of FIG. 22 will hereinafter be described, focusing mainly on the differences with the embodiment of FIG. 5. To the extent that details concerning various elements have been omitted herein, it may be assumed that these details are at least similar to corresponding elements previously described.

Referring to FIG. 22, the voltage connecting lines VCE may extend primarily in the first direction (e.g. the X-axis direction), and the first driving voltage lines VDDL may extend primarily in the second direction (e.g. the Y-axis direction). The voltage connecting lines VCE may be disposed in the wiring area LA, and the first driving voltage lines VDDL may be disposed in the pixel area PA and in the wiring area LA. In the pixel area PA, the first driving voltage lines VDDL may be connected to the voltage connecting lines VCE.

Since the voltage connecting lines VCE extend primarily in the first direction (e.g. the X-axis direction), one of the voltage connecting lines VCE may be disposed on one side of the light-transmitting area TA, e.g., on the upper side of the light-transmitting area TA, and another one of the voltage connecting lines VCE may be disposed on the other side of the light-transmitting area TA, e.g., on the lower side of the light-transmitting area TA.

According to the embodiment of FIG. 22, due to the presence of the voltage connecting lines VCE, the first driving voltage lines VDDL, which are disposed in the pixel area PA, on the upper side of the light-transmitting area TA, do not need to be connected to the first driving voltage lines VDDL, which are disposed in the pixel are PA, on the lower side of the light-transmitting area TA. Thus, the first driving voltage lines VDDL may be omitted from the wiring area LA. Thus, the arrangement of wires in the wiring area LA can be simplified.

Second voltage connecting lines which are connected to the initialization voltage lines VIL may be additionally provided, in which case, the second voltage connecting lines may extend primarily in the second direction (e.g. the Y-axis direction) since the initialization voltage lines VIL extend primarily in the first direction (e.g. the X-axis direction).

Figure 23:
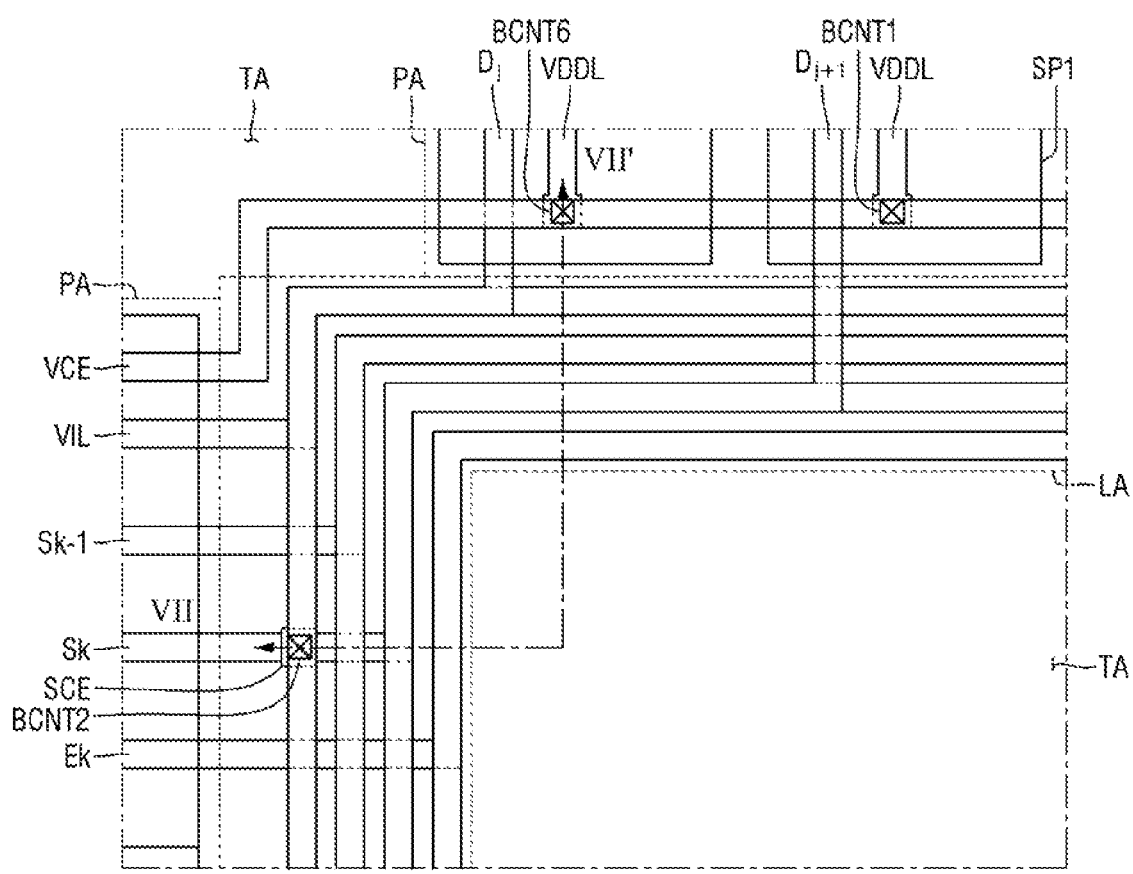
FIG. 23 is a plan view illustrating an area B of FIG. 22.
Figure 24:
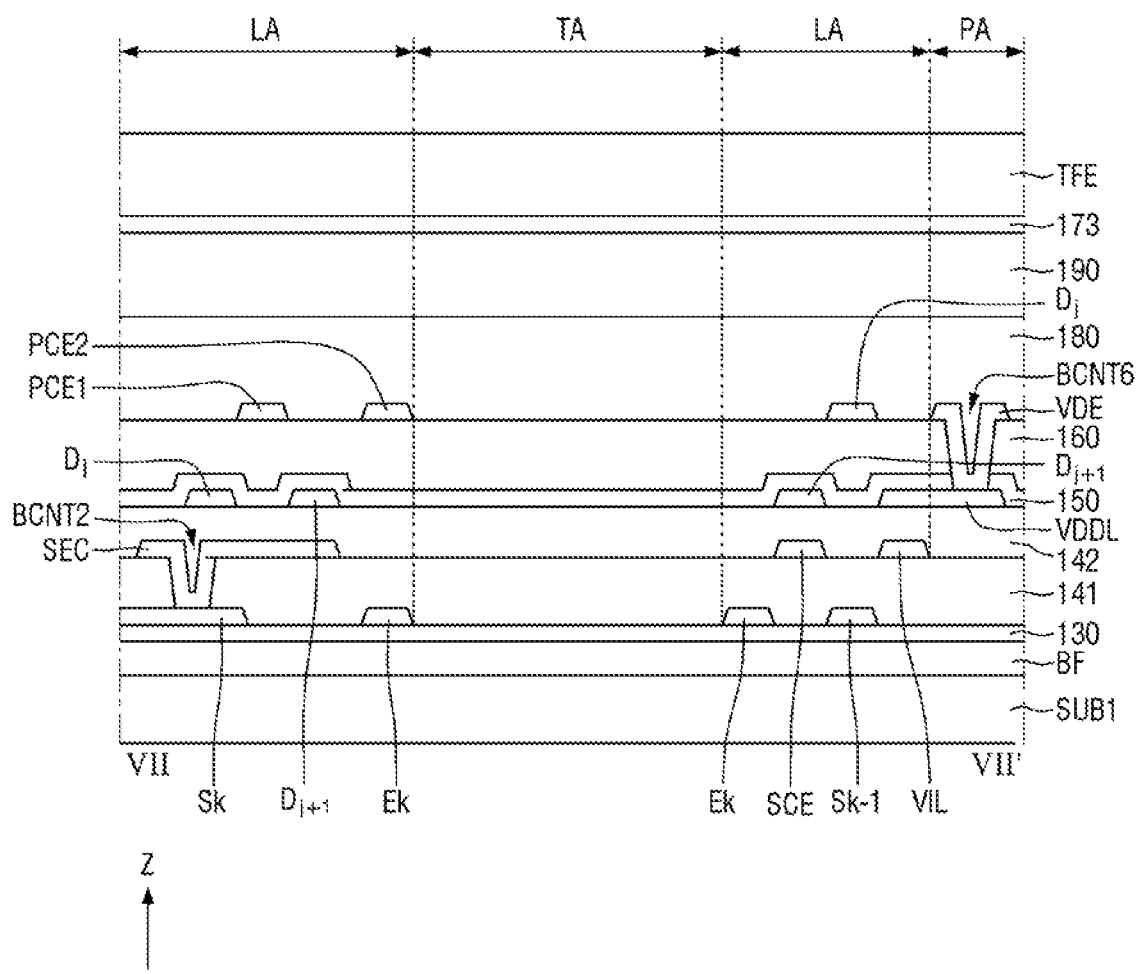
FIG. 24 is a cross-sectional view taken along line VII-VII' of FIG. 23.

FIG. 23 is a plan view illustrating an area B of FIG. 22. FIG. 24 is a cross-sectional view taken along line VII-VII' of FIG. 23.

The embodiment of FIGS. 23 and 24 differs from the embodiment of FIGS. 14 and 15 in that a voltage connecting line VCE which is connected to the first driving voltage lines VDDL is additionally provided, and that the first and second power supply connecting lines PCE1 and PCE2 are not provided. To the extent that details concerning various elements have been omitted herein, it may be assumed that these details are at least similar to corresponding elements previously described.

Referring to FIGS. 23 and 24, the voltage connecting line VCE may be connected to a plurality of first driving voltage lines VDDL in the pixel area PA. For example, a plurality of first driving voltage lines VDDL at least partially overlapping with first subpixels SP1 that are adjacent to one another in the first direction (e.g. the X-axis direction) may be connected to a single voltage connecting line VCE.

The voltage connecting line VCE may be disposed in a different layer from the first driving voltage lines VDDL. In this case, the voltage connecting line VCE may be connected to the first driving voltage lines VDDL through sixth connecting contact holes BCNT6. For example, the voltage connecting line VCE may be formed of the second source metal layer DTL2 and may be disposed on the first planarization film 160, as illustrated in FIG. 24, but the present disclosure is not limited thereto. In another example, the voltage connecting line VCE may be formed of the first gate metal layer GTL1 and may be disposed on the gate insulating film 130. In yet another example, the voltage connecting line VCE may be formed of the second gate metal layer GTL2 and may be disposed on the first interlayer insulating film 141.

Alternatively, the voltage connecting line VCE may be disposed in the same layer as the first driving voltage lines VDDL. In this case, the voltage connecting line VCE may be connected to the first driving voltage lines VDDL without the need of contact holes. In order for the voltage connecting line VCE to be disposed in the same layer as the first driving voltage lines VDDL, the j- and (j+1)-th data lines $D_j$ and $D_{j+1}$ may be connected to data connecting electrodes in the pixel area PA. The data connecting electrodes may be formed in the same layer as the first driving voltage lines VDDL and may be disposed on the first planarization film 160.

In the embodiment of FIGS. 23 and 24, the initialization line VIL and the (k–1)-th scan line Sk–1, which are adjacent to each other, may be disposed to at least partially overlap with each other in the thickness direction, and the first scan connecting line SCE1 and the k-th emission line Ek, which are adjacent to each other, may be disposed to at least partially overlap with each other in the thickness direction. In this case, the width of the wiring area LA can be further reduced, and as a result, the light-transmitting area TA can be further widened.

According to the aforementioned and other embodiments of the present disclosure, since a sensor area of a display panel of a display device includes a light-transmitting area that transmits light therethrough, light can be incident from the top surface of the display device upon sensor devices, which are disposed on the bottom surface of the display panel, through the light-transmitting area, even if the sensor devices are disposed to overlap with the sensor area in the thickness direction of the display panel. Accordingly, the degradation of the sensing capabilities of the sensor devices can be prevented or reduced.

In addition, since six transistors are not provided in first subpixels, a wiring area can be provided in regions where the sixth transistors are not provided, and as a result, a light-transmitting area can be widened.

Moreover, the distance between adjacent wires can become narrower when the adjacent wires are disposed in different layers in the wiring area than when the adjacent wires are disposed in the same layer in the wiring area, and as a result, the light-transmitting area can be widened.

Furthermore, since first driving voltage lines are connected to a voltage connecting line, first driving voltage lines on one side of the light-transmitting area do not need to be connected, via the wiring area, to first driving voltage lines on the other side of the light-transmitting area. Thus, since the first driving voltage lines are not provided in the wiring area, the arrangement of wires in the wiring area can be simplified.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A display device, comprising:
a display panel including a main area and a sensor area; and
a plurality of sensor devices at least partially overlapping the sensor area of the display panel in a thickness direction of the display panel,
wherein the display panel includes a plurality of first subpixels disposed in the sensor area and a plurality of second subpixels disposed in the main area, and
wherein the number of transistors of each of the plurality of first subpixels is different from the number of transistors of each of the plurality of second subpixels.

2. The display device of claim 1, wherein the number of transistors of each of the plurality of first subpixels is smaller than the number of transistors of each of the plurality of second subpixels.

3. The display device of claim 2, wherein
the display panel further includes scan lines, data lines, and emission lines, and
the first plurality of subpixels and the second plurality of subpixels each include:
a driving transistor controlling a driving current that flows from a first electrode to a second electrode of the driving transistor, in accordance with a data voltage applied to a gate electrode of the driving current;
a light-emitting element connected to the second electrode of the driving transistor,
a first transistor that is turned on by a scan signal from one of the scan lines so as to connect the gate electrode of the driving transistor and an initialization voltage line to which an initialization voltage is applied;
a second transistor that is turned on by a scan signal from another one of the scan lines so as to connect the first electrode of the driving transistor and one of the data lines;
a third transistor that is turned on by a scan signal from yet another one of the scan lines so as to connect the first and second electrodes of the driving transistor;
a fourth transistor that is turned on by an emission signal from one of the emission signals so as to connect the first electrode of the driving transistor and a first driving voltage line to which a first driving voltage is applied; and
a fifth transistor that is turned on by an emission signal from another one of the emission lines so as to connect the second electrode of the driving transistor and the light-emitting element.

4. The display device of claim 3, wherein each of the second subpixels further includes a sixth transistor that is turned on by a scan signal from yet still another one of the scan lines so as to connect a first electrode of the light-emitting element and the initialization voltage line.

5. The display device of claim 1, wherein
the display panel further includes scan lines which at least partially overlap with the first subpixels and the second subpixels and to which scan signals are applied, and
the number of scan lines at least partially overlapping with each of the first subpixels is different from the number of scan lines at least partially overlapping with each of the second subpixels.

6. The display device of claim 5, wherein the number of scan lines at least partially overlapping with each of the first subpixels is smaller than the number of scan lines at least partially overlapping with each of the second subpixels.

7. The display device of claim 6, wherein the display panel further includes a light-transmitting area disposed in the sensor area, the light transmitting area not overlapping with the first subpixels.

8. The display device of claim 7, wherein the light-transmitting area is at least partially surrounded by the first subpixels.

9. The display device of claim 7, wherein the display panel further includes a first scan connecting line connected to one of the scan lines in a wiring area between the light-transmitting area and the first subpixels, and wherein the first scan connecting line is disposed in a different layer from the scan lines.

10. The display device of claim 9, wherein
the display panel further includes an insulating film disposed between the first scan connecting line and the scan line to which the first scan connecting line is connected, and
the first scan connecting line is connected to the scan line that it is connected, through a contact hole which penetrates the insulating film.

11. The display device of claim 9, wherein the display panel further includes initialization voltage lines which at least partially overlap with the first subpixels and the second subpixels and to which initialization voltages are applied, data lines which at least partially overlap with the first subpixels and the second subpixels and to which data voltages are applied, and first driving voltage lines which at least partially overlap with the first subpixels and the second subpixels and to which first driving voltages are applied.

12. The display device of claim 11, wherein the display panel further includes a power supply connecting line connected to one of the first driving voltage lines in the wiring area and is disposed in a different layer from the first driving voltage lines.

13. The display device of claim 11, wherein one of the data lines at least partially overlaps with one of the initialization voltage lines or the first scan connecting line in the wiring area.

14. The display device of claim 12, wherein the power supply connecting line at least partially overlaps with one of the scan lines.

15. The display device of claim 12, wherein
the display panel further includes an insulating film disposed between the power supply connecting line and one of the first driving voltage lines, and
the power supply connecting line is connected to the first driving voltage line that it is connected, through a contact hole which penetrates the insulating film.

16. The display device of claim 12, wherein
the power supply connecting line is disposed on the data lines and on the first driving voltage lines,
the data lines and the first driving voltage lines are disposed between the initialization voltage lines and the first scan connecting line, and
the initialization voltage lines and the first scan connecting line are disposed on the scan lines.

17. The display device of claim 12, wherein the display panel further includes an initialization connecting line connected to one of the initialization voltage lines, and wherein the initialization connection line is disposed in a different layer from the initialization voltage lines.

18. The display device of claim 17, wherein one of the data lines at least partially overlaps with the initialization connecting line or the first scan connecting line in the wiring area.

19. The display device of claim 17, wherein
the display panel further includes an insulating film disposed between the initialization connecting line and one of the initialization voltage lines, and
the initialization connecting line is connected to the initialization voltage line that it is connected, through a contact hole which penetrates the insulating film.

20. The display device of claim 17, wherein
the power supply connecting line is disposed on the data lines and on the first driving voltage lines,
the data lines and the first driving voltage lines are disposed on the scan lines, and
the scan lines are disposed on the initialization connecting line and on the first scan connecting line.

21. The display device of claim 12, wherein the display panel further includes a second scan connecting line connected to another one of the scan lines and is disposed in a different layer from the scan lines, emission lines which at least partially overlap with the first subpixels and the second subpixels and to which emission signals are applied, and an emission connecting line connected to one of the emission lines and is disposed in a different layer from the emission lines.

22. The display device of claim 21, wherein in the wiring area, one of the data lines at least partially overlaps with the second scan connecting line, and another one of the data lines at least partially overlaps with the emission connecting line.

23. The display device of claim 21, wherein the second scan connecting line and the emission connecting line are disposed in the same layer.

24. The display device of claim 21, wherein
the power supply connecting line is disposed on the data lines and on the first driving voltage lines,
the data lines and the first driving voltage lines are disposed on the initialization voltage lines and the first scan connecting line,
the initialization voltage lines and the first scan connecting line are disposed on the scan lines and on the emission lines, and
the scan lines and the emission lines are disposed on the second scan connecting line and on the emission connecting line.

25. The display device of claim 11, wherein the display panel further includes a voltage connecting line connected to the first driving voltage lines.

26. The display device of claim 25, wherein
the first driving voltage lines extend primarily in a first direction, and
the voltage connecting line extends primarily in a second direction.

27. The display device of claim 25, wherein the voltage connecting line is disposed on the first driving voltage lines.

28. The display device of claim 25, wherein the first driving voltage lines are disposed on the voltage connecting line.

29. The display device of claim 28, wherein the voltage connecting line is disposed in the same layer as the initialization voltage lines and is disposed on the scan lines.

30. The display device of claim 28, wherein the initialization voltage lines are disposed on the voltage connecting line and are disposed in the same layer as the scan lines.

31. The display device of claim 25, wherein the first driving voltage lines are disposed in the same layer as the voltage connecting line.

32. A display device, comprising:
a display panel including a main area and a sensor area; and
sensor devices at least partially overlapping with the sensor area of the display panel in a thickness direction of the display panel,
wherein the display panel includes a plurality of first subpixels which are disposed in the sensor area, a plurality of second subpixels which are disposed in the main area, first driving voltage lines which at least partially overlap with the plurality of first subpixels and the plurality of second subpixels and to which first driving voltages are applied, and a power supply connecting line connected to the first driving voltage lines, and
wherein the power supply connecting line is disposed in a different layer from the first driving voltage lines.

33. A display device, comprising:
a light-transmitting area;
a plurality of subpixels at least partially surrounding the light-transmitting area;
first conductive lines connected to the plurality of subpixels; and
second conductive lines connected to the first conductive lines in a wiring area between the light-transmitting area and the subpixels,
wherein the first conductive lines are disposed in a different layer from the second conductive lines.

* * * * *